United States Patent
Baek et al.

(10) Patent No.: US 10,903,229 B2
(45) Date of Patent: Jan. 26, 2021

(54) THREE-DIMENSIONAL SEMICONDUCTOR MEMORY DEVICE WITH CENTRAL CONNECTION THROUGH REGION

(71) Applicant: Samsung Electronics Co., Ltd., Suwon-si (KR)

(72) Inventors: Seok Cheon Baek, Hwaseong-si (KR); Sung Hun Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 167 days.

(21) Appl. No.: 16/162,533

(22) Filed: Oct. 17, 2018

(65) Prior Publication Data
US 2019/0237477 A1    Aug. 1, 2019

(30) Foreign Application Priority Data
Jan. 26, 2018 (KR) .................. 10-2018-0010146

(51) Int. Cl.
| | |
|---|---|
| *H01L 27/11582* | (2017.01) |
| *H01L 27/11573* | (2017.01) |
| *H01L 29/423* | (2006.01) |
| *G11C 7/18* | (2006.01) |
| *G11C 8/14* | (2006.01) |
| *H01L 27/1157* | (2017.01) |
| *G11C 5/02* | (2006.01) |

(52) U.S. Cl.
CPC ........ *H01L 27/11582* (2013.01); *G11C 5/025* (2013.01); *G11C 7/18* (2013.01); *G11C 8/14* (2013.01); *H01L 27/1157* (2013.01); *H01L 27/11573* (2013.01); *H01L 29/4234* (2013.01)

(58) Field of Classification Search
CPC ......... H01L 27/11582; H01L 27/11575; H01L 27/11551; H01L 27/11565; H01L 27/11573
See application file for complete search history.

(56) References Cited

U.S. PATENT DOCUMENTS

| | | |
|---|---|---|
| 8,652,921 B2 | 2/2014 | Lee et al. |
| 9,165,937 B2 | 10/2015 | Yip et al. |
| 9,224,747 B2 | 12/2015 | Mizutani et al. |
| 9,356,038 B2 | 5/2016 | Lee et al. |
| 9,424,928 B2 | 8/2016 | Hwang et al. |
| 9,515,084 B2 | 12/2016 | Oh et al. |
| 9,595,533 B2 | 3/2017 | Tanzawa et al. |
| 9,721,663 B1 | 8/2017 | Ogawa et al. |
| 2012/0280299 A1* | 11/2012 | Yun ................... H01L 27/11582 257/314 |
| 2015/0371925 A1 | 12/2015 | Thimmegowda et al. |

(Continued)

*Primary Examiner* — John P. Dulka
(74) *Attorney, Agent, or Firm* — Lee IP Law, P.C.

(57) ABSTRACT

A three-dimensional semiconductor memory device including a gate-stack structure on a base substrate, the gate-stack structure including gate electrodes stacked in a direction perpendicular to a surface of the base substrate and spaced apart from each other; a through region penetrating through the gate-stack structure and surrounded by the gate-stack structure; and first vertical channel structures and second vertical channel structures on both sides of the through region and penetrating through the gate-stack structure, wherein the through region is between the first vertical channel structures and the second vertical channel structures.

18 Claims, 38 Drawing Sheets

(56) References Cited

U.S. PATENT DOCUMENTS

| | | | |
|---|---|---|---|
| 2016/0163726 A1* | 6/2016 | Tanzawa | H01L 27/11575 |
| | | | 257/314 |
| 2017/0179026 A1 | 6/2017 | Toyama et al. | |
| 2017/0207232 A1* | 7/2017 | You | H01L 27/11582 |
| 2019/0139978 A1* | 5/2019 | Kim | H01L 27/11575 |
| 2019/0214404 A1* | 7/2019 | Ahn | H01L 29/40117 |
| 2019/0312051 A1* | 10/2019 | Park | H01L 23/5226 |
| 2019/0319038 A1* | 10/2019 | Zhang | H01L 23/535 |
| 2019/0319042 A1* | 10/2019 | Baek | H01L 27/11578 |
| 2019/0378855 A1* | 12/2019 | Kim | H01L 27/11582 |
| 2019/0393240 A1* | 12/2019 | Kim | H01L 27/11548 |

* cited by examiner

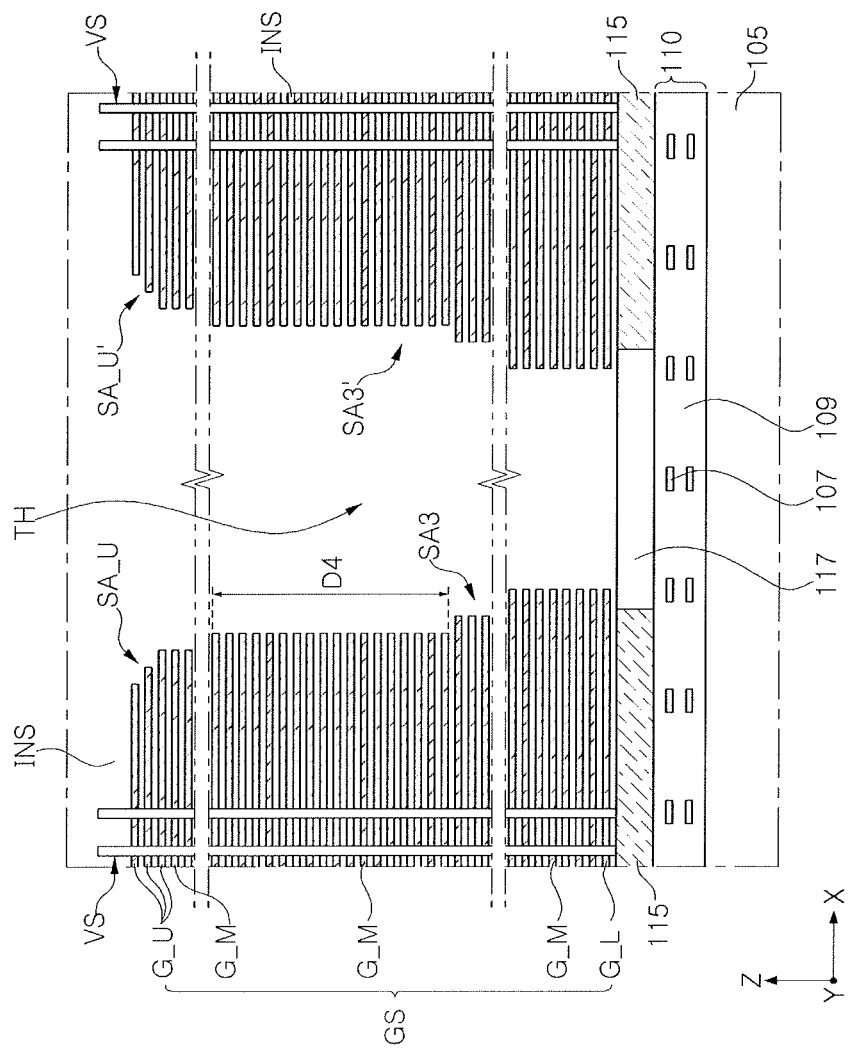

US 10,903,229 B2

THREE-DIMENSIONAL SEMICONDUCTOR MEMORY DEVICE WITH CENTRAL CONNECTION THROUGH REGION

CROSS-REFERENCE TO RELATED APPLICATION

Korean Patent Application No. 10-2018-0010146 filed on Jan. 26, 2018 in the Korean Intellectual Property Office, and entitled: "Three-Dimensional Semiconductor Memory Device," is incorporated by reference herein in its entirety.

BACKGROUND

1. Field

Embodiments relate to a three-dimensional semiconductor memory device.

2. Description of the Related Art

Semiconductor devices including gate electrodes stacked in a direction perpendicular to a surface of a semiconductor substrate have been developed. The amount of the stacked gate electrodes has increased to allow semiconductor devices to be highly integrated.

SUMMARY

The embodiments may be realized by providing a three-dimensional semiconductor memory device including a gate-stack structure on a base substrate, the gate-stack structure including gate electrodes stacked in a direction perpendicular to a surface of the base substrate and spaced apart from each other; a through region penetrating through the gate-stack structure and surrounded by the gate-stack structure; and first vertical channel structures and second vertical channel structures on both sides of the through region and penetrating through the gate-stack structure, wherein the through region is between the first vertical channel structures and the second vertical channel structures.

The embodiments may be realized by providing a three-dimensional semiconductor memory device including a first outer step region and a second outer step region on a base substrate; a plurality of memory cell array regions between the first outer step region and the second outer step region; an inner step region between the plurality of memory cell array regions; a gate-stack structure in the plurality of memory cell array regions, the gate-stack structure extending to the first outer step region and the second outer step region and the inner step region; and a through region penetrating through the gate-stack structure in the inner step region.

The embodiments may be realized by providing a three-dimensional semiconductor memory device including a gate-stack structure on a base substrate; and a through region penetrating through the gate-stack structure, the through region being surrounded by the gate-stack structure, wherein the gate-stack structure includes word lines, and first and second select lines, on the word lines and extending in a first direction that is parallel to a surface of the base substrate, the word lines include inner contact regions having a shape of a step that steps downwardly in the first direction toward the through region and a shape of a step that steps downwardly in a second direction toward the through region, and the second direction is parallel to the surface of the base substrate and perpendicular to the first direction.

BRIEF DESCRIPTION OF THE DRAWINGS

Features will be apparent to those of skill in the art by describing in detail exemplary embodiments with reference to the attached drawings in which:

FIGS. 23A and 23B illustrate cross-sectional views of a modification of a 3D semiconductor memory device according to an example embodiment.

DETAILED DESCRIPTION

Figure 1:
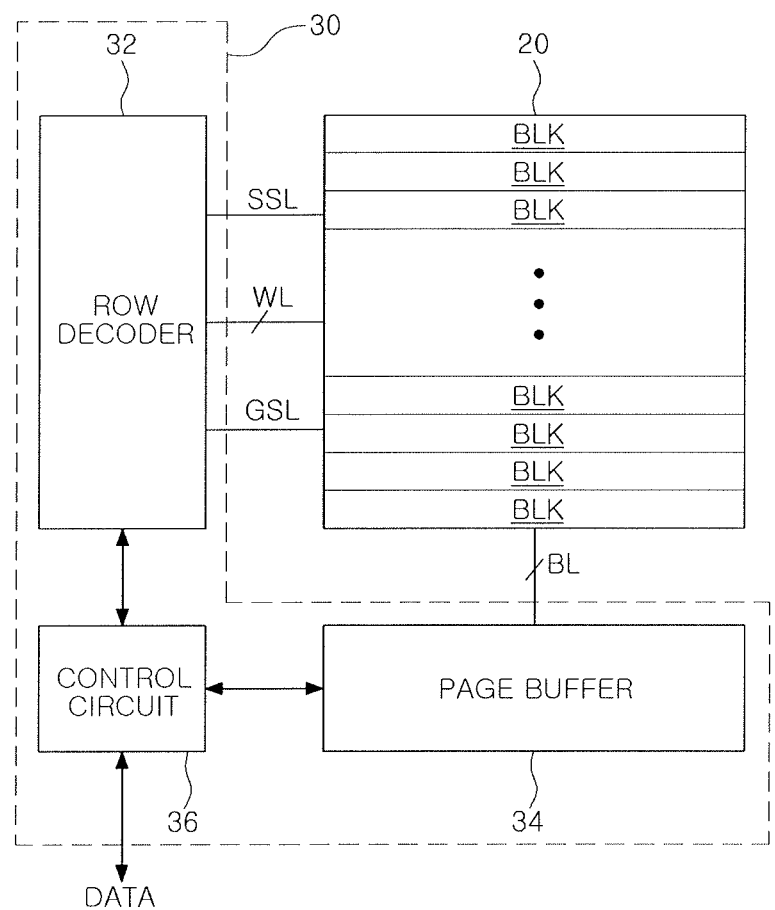
FIG. 1 illustrates a schematic block diagram of a three-dimensional (3D) semiconductor memory device according to an example embodiment.

An example of a three-dimensional (3D) semiconductor memory device according to an embodiment of will be described with reference to FIG. 1. FIG. 1 illustrates a schematic block diagram of a semiconductor device according to an example embodiment.

Referring to FIG. 1, a 3D semiconductor memory device 10 according to an example embodiment may include a memory cell array region 20 and a control logic region 30. The memory cell array region 20 may include a plurality of memory blocks, and each memory block may include a plurality of memory cells. The control logic region 30 may include a row decoder 32, a page buffer 34 and a control circuit 36.

The plurality of memory cells in the memory cell array region 20 may be connected to the row decoder 32 through a string select line SSL, a plurality of word lines WL, and a ground select line GSL and may be connected to the page buffer 34 via bit lines BL.

In an implementation, a plurality of memory cells arranged in the same row may be connected to the same word line WL and a plurality of memory cells arranged in the same column may be connected to the same bit line BL.

The row decoder 32 may decode an input address to generate and deliver driving signals of the word line WL. Under the control of the control circuit 36, the row decoder 32 may provide a word line voltage generated by a voltage generating circuit of the control circuit 36 to a selected word line WL among the word lines WL and unselected word lines WL among the word lines WL.

The page buffer 34 may be connected to the memory cell array region 20 through the bit lines BL to read data stored in the memory cells. The page buffer 34 may temporarily store data to be stored in the memory cells or sense data stored in the memory cells according to an operation mode. The page buffer 34 may include a column decoder and a sense amplifier.

The column decoder may selectively activate the bit lines BL of the memory cell array region 20. The sense amplifiers may sense a voltage of a bit line BL selected by the column decoder and read data stored in a selected memory cell during a read operation. The control circuit 36 may control operations of the row decoder 32 and the page buffer 34. The control circuit 36 may receive a control signal as well as an external voltage delivered from the outside, and operate according to the received control signal. The control circuit 36 may include a voltage generating circuit generating voltages necessary for an internal operation, e.g., a program voltage, a read voltage, an erase voltage, and the like, using an external voltage. The control circuit 36 may control read, write and/or erase operations in response to the control signals. Further, the control circuit 36 may include an input/output circuit. The input/output circuit may receive data DATA and transfer the data to the page buffer 34 during a program operation and output the data DATA received from the page buffer 34 to the outside during a read operation.

Figure 2:
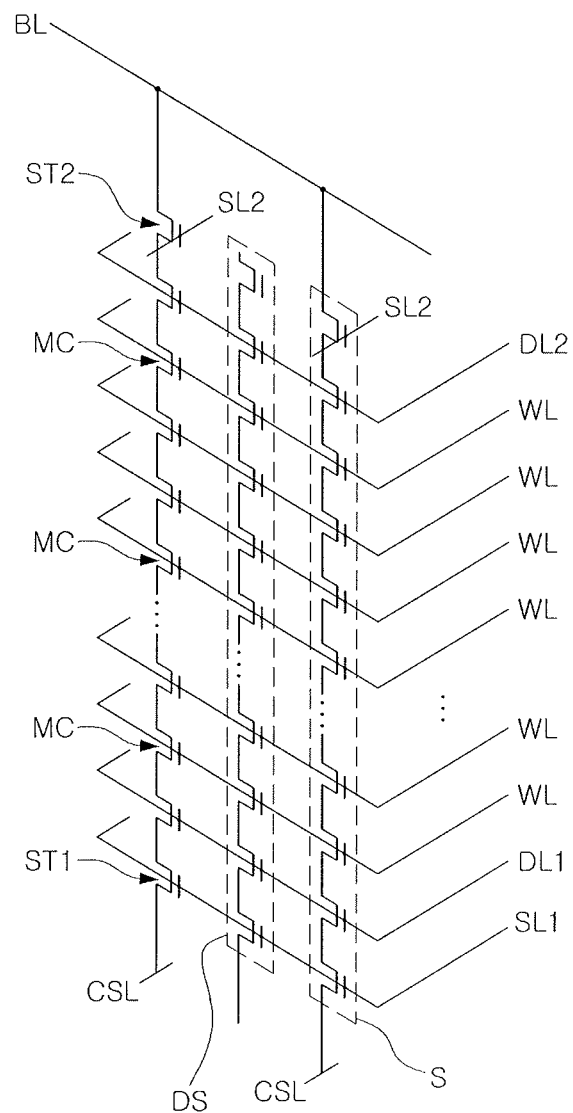
FIG. 2 illustrates a circuit diagram of an example of a memory cell array region of a 3D semiconductor memory device according to an example embodiment.

An example of a circuit of each memory block BLK of the memory cell array region (20 in FIG. 1) of the 3D semiconductor memory device (10 in FIG. 1) will be described with reference to FIG. 2. FIG. 2 illustrates a circuit diagram of an example of the memory cell array region (20 in FIG. 1).

Referring to FIG. 2, each of the memory blocks BLK of the memory cell array region 20 may include memory cells MC connected to each other in series and a first select transistor ST1 and a second select transistor ST2 connected to both ends of the memory cells MC in series.

The first and second select transistors ST1 and ST2 and the memory cells MC between the first and second select transistors ST1 and ST2 may configure memory strings S. The memory cells MC connected to each other in series may be connected to the word lines WL for selecting the memory cells MC, respectively.

A gate terminal of the first select transistor ST1 may be connected to a first select line SL1 and a source terminal thereof may be connected to a common source line CSL. A gate terminal of the second select transistor ST2 may be connected to a second select line SL2 and a source terminal thereof may be connected to a drain terminal of each of the memory cells MC.

In an implementation, the first select transistor ST1 may be a ground select transistor and the second select transistor ST2 may be a string select transistor ST2.

In an implementation, the first select line SL1 may be the ground select line (GSL in FIG. 1) and the second select line SL2 may be the string select line (SSL in FIG. 1).

Although a structure in which the first select transistor ST1 and the second select transistor ST2 are connected to the memory cells MC, connected to each other in series, one by one, is illustrated in FIG. 2, a plurality of first select transistors ST1 or the plurality of second select transistors ST2 may also be connected to the memory cells MC.

In an implementation, a first dummy line DL1 may be disposed between a lowermost word line, among the word lines WL, and the first select line SL1, and a second dummy line DL2 may be disposed between an uppermost word line WL and the second select line SL2. One or a plurality of the first dummy lines DL1 may be disposed and one or a plurality of the second dummy lines DL2 may be disposed.

A drain terminal of the second select transistor ST2 may be connected to the bit line BL. When a signal is applied to a gate terminal of the second select transistor ST2 through the second select line SL2, a signal applied through the bit line BL is transmitted to the memory cells MC connected to each other in series, thereby performing a data reading or writing operation. Further, by applying a predetermined erase voltage through the substrate, an erase operation for erasing data written in the memory cells MC may be executed.

The semiconductor device according to an example embodiment may include at least one dummy string DS. The dummy string DS may be a string including a dummy channel electrically separated from the bit line BL.

Figure 3:
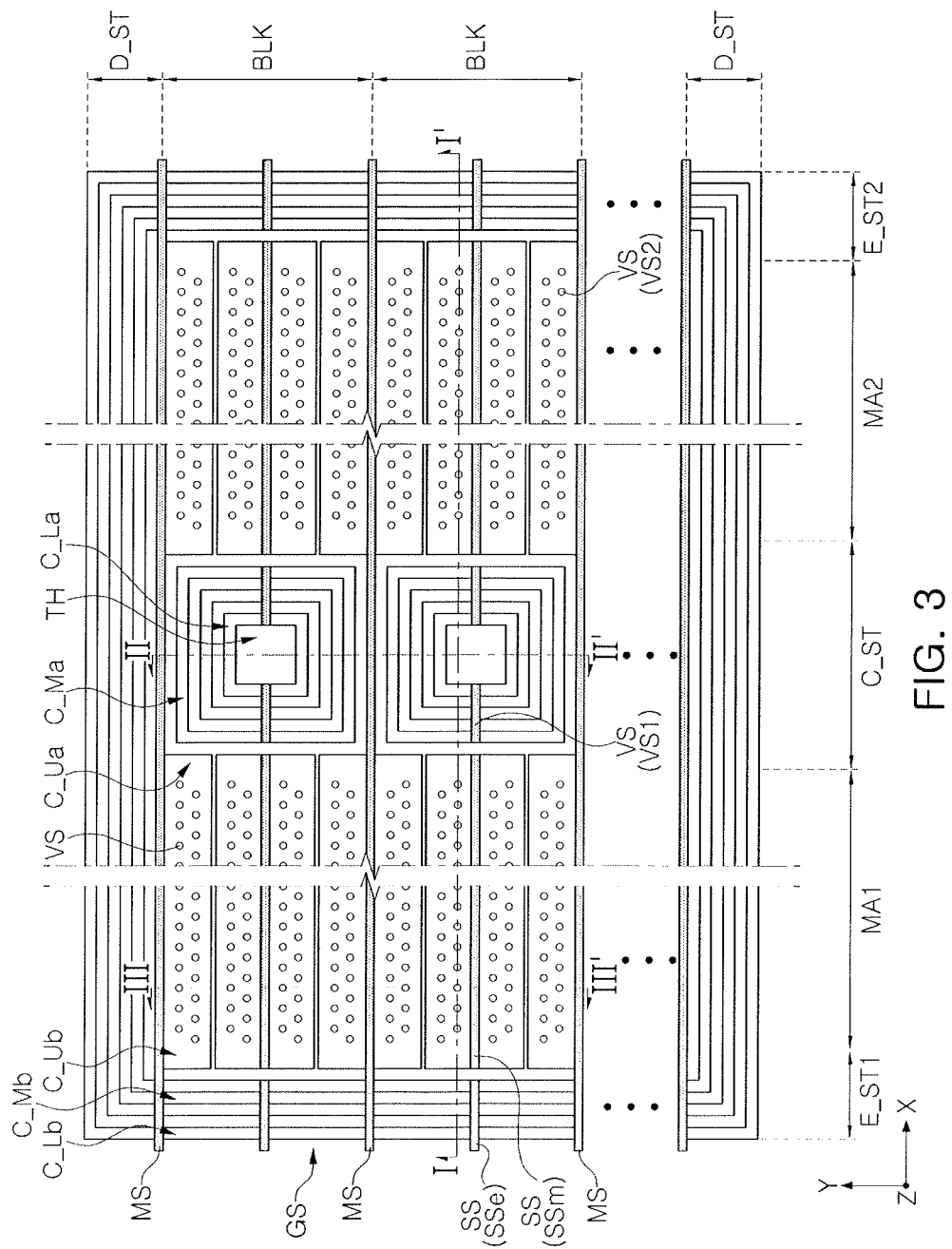
FIG. 3 illustrates a plan view of an example of a 3D semiconductor memory device according to an example embodiment.
Figure 4:
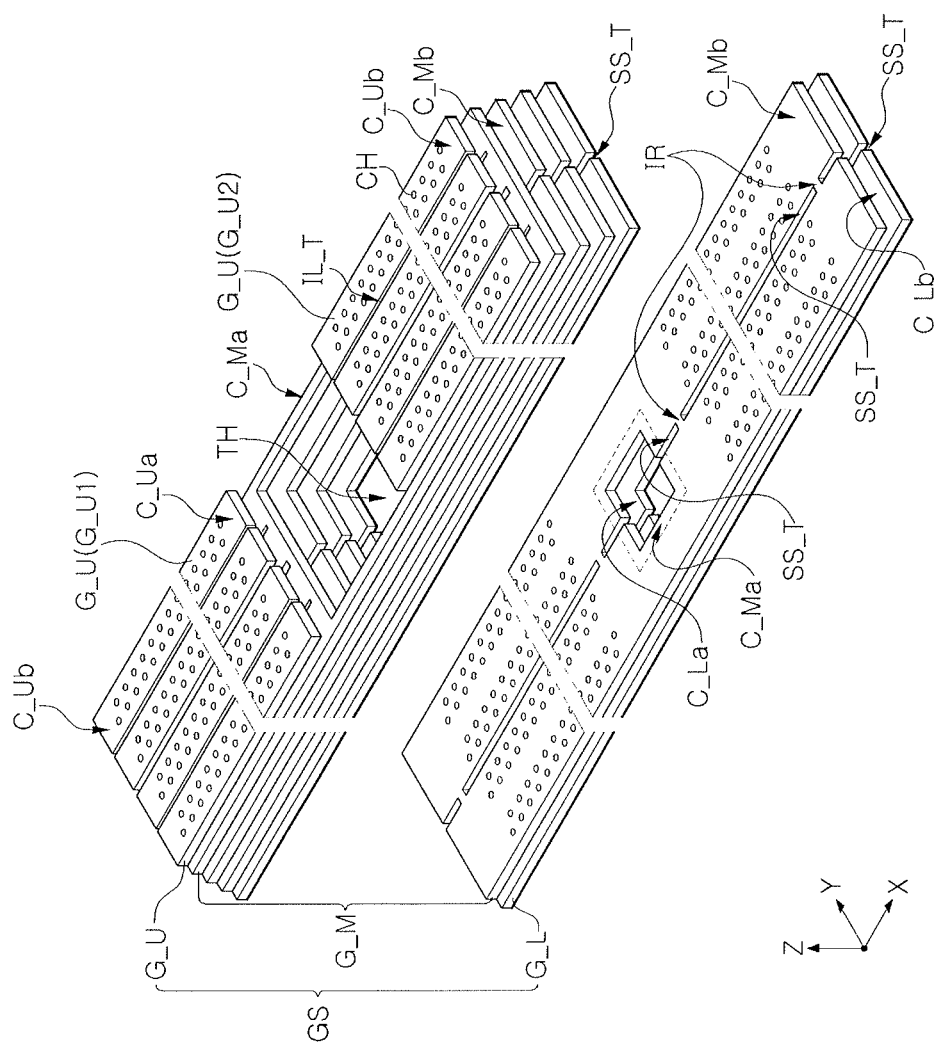
FIG. 4 illustrates a perspective view of an example of a 3D semiconductor memory device according to an example embodiment.
Figure 5A:
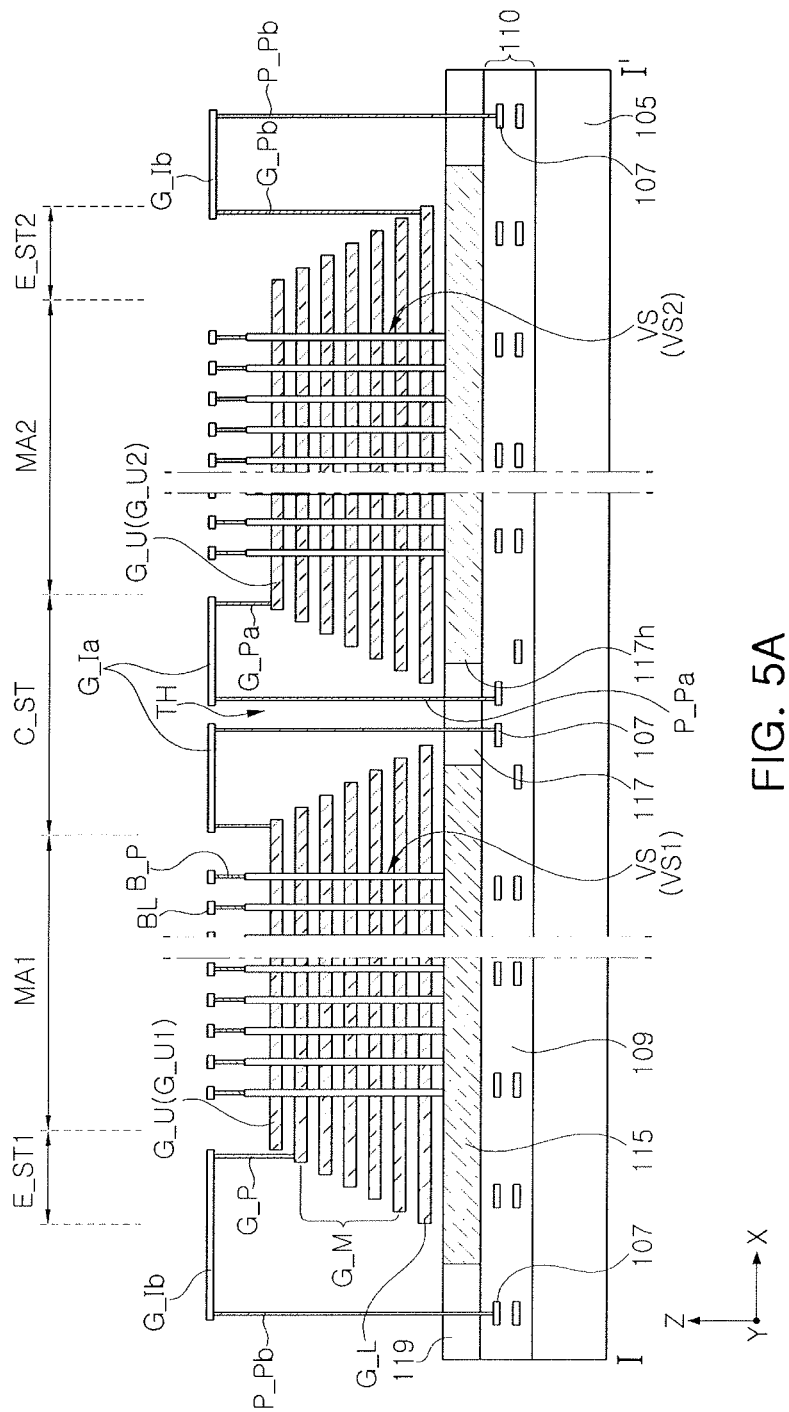
FIGS. 5A to 5C illustrate cross-sectional views of an example of a 3D semiconductor memory device according to an example embodiment.
Figure 5B:
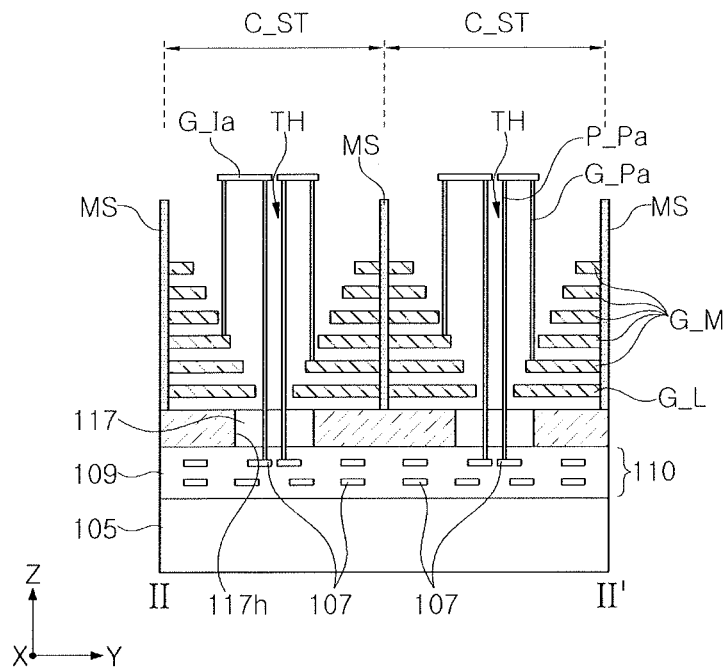
Figure 5C:
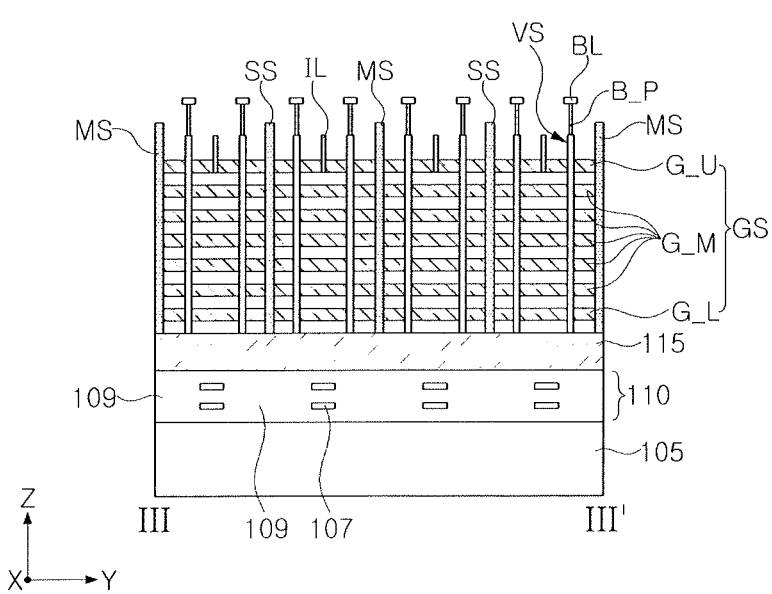

Next, examples of a 3D semiconductor memory device according to an example embodiment will be described. First, an example of a 3D semiconductor memory device according to an example embodiment will be described with reference to FIGS. 3, 4, 5A, 5B, and 5C. FIG. 3 illustrates a plan view of an example of a 3D semiconductor memory device according to an example embodiment, FIG. 4 illustrates a perspective view of an example of a 3D semiconductor memory device according to an example embodiment, and FIGS. 5A to 5C illustrate cross-sectional views of an example of a 3D semiconductor memory device according to an example embodiment. In FIGS. 5A to 5C, FIG. 5A illustrates a cross-sectional view of a region taken along line I-I' of FIG. 3, FIG. 5B illustrates a cross-sectional view of a region taken along line II-II' of FIG. 3, and FIG. 5C illustrates a cross-sectional view of a region taken along line of FIG. 3.

Referring to FIGS. 3, 4, 5A, 5B, and 5C, a lower structure 110 including a peripheral circuit 107 may be disposed on a lower substrate 105. The lower substrate 105 may be a semiconductor substrate which may be formed of a semiconductor material such as a single crystal silicon, or the like.

The lower structure 110 may include a lower insulator 109 covering the peripheral circuit 107. The peripheral circuit 107 may be a circuit which may be formed in the control logic region 30 illustrated in FIG. 1 (30 in FIG. 1). The peripheral circuit 107 may include peripheral lines electrically connecting peripheral transistors so as to configure the peripheral transistors and circuits. The lower insulator 109 may be formed of an insulating material such as silicon oxide, or the like.

A base substrate 115 may be disposed on the lower structure 110. The base substrate 115 may be a semiconductor substrate which may be formed of a semiconductor material such as polysilicon.

A gap fill insulating layer 117 may be disposed in a hole 117h penetrating through the base substrate 115. The gap fill insulating layer 117 may penetrate through at least a portion of the base substrate 115. A middle insulating layer 119 surrounding a side surface of the base substrate 115 may be disposed. The gap fill insulating layer 117 and the middle insulating layer 119 may be formed of an insulating material such as silicon oxide.

Memory cell array regions MA1 and MA2 arranged in sequence in a first direction X may be disposed on the base substrate 115. The memory cell array regions MA1 and MA2 may include a first memory cell array region MA1 and a second memory cell array region MA2. Each of the first and second memory cell array regions MA1 and MA2 may correspond to the memory cell array region (20 in FIG. 1) described above with reference to FIG. 1.

An inner step region C_ST may be disposed between the first memory cell array region MA1 and the second memory cell array region MA2.

A first outer step region E_ST1 facing or opposite to the inner step region C_ST with the first memory cell array region MA1 interposed therebetween may be disposed. For example, the first memory cell array region MA1 may be disposed between the inner step region C_ST and the first outer step region E_ST1.

A second outer step region E_ST2 facing or opposite to the inner step region C_ST may be disposed with the second memory cell array region MA2 interposed therebetween. For example, the second memory cell array region MA2 may be disposed between the inner step region C_ST and the second outer step region E_ST2.

In an implementation, the first outer step region E_ST1, the inner step region C_ST, and the second edge step region E_ST2 may be arranged in the first direction X in order.

Dummy step regions D_ST arranged in a second direction Y, perpendicular to the first direction X, and facing or opposite to each other may be disposed on the plane. The first and second memory cell array regions MA1 and MA2, the first outer step region E_ST1, the inner step region C_ST, and the second edge step region E_ST2 may be disposed between the dummy step regions D_ST.

Through regions TH may be disposed in the inner step region C_ST.

In an implementation, a stack structure GS may be disposed in the plurality of memory cell array regions, e.g., in the first and second memory cell array regions MA1 and MA2 and extending to the first and second outer step regions E_ST1 and E_ST2. Each of the through regions TH may penetrate through the gate-stack structure GS in or at the inner step region C_ST and may be surrounded by the gate-stack structure GS. On the same plane, the through region TH may be surrounded by one middle gate electrode G_M, e.g., one word line WL.

The gate-stack structure GS may include gate electrodes G_L, G_M, and G_U sequentially stacked in a third direction Z, perpendicular to the surface of the base substrate 115 on the base substrate 115, and spaced apart from each other.

The gate electrodes G_L, G_M, and G_U may be sequentially stacked in the first and second memory cell array regions MA1 and MA2, may be spaced apart from each other, and may extend to the inner step region C_ST and the first and second outer step regions E_ST1 and E_ST2. The gate electrodes G_L, G_M and G_U may be formed of a conductive material including at least one of a metal nitride such as a doped polysilicon, titanium nitride, and a metal such as tungsten.

The gate electrodes G_L, G_M and G_U may include a lower gate electrode G_L, a middle gate electrodes G_M on the lower gate electrode G_L, and an upper gate electrode G_U on the middle gate electrodes G_M. In an implementation, the upper gate electrode G_U may be only one electrode in the third direction Z. In an implementation, the upper gate electrode G_U may include a plurality of electrodes spaced apart from each other in the third direction Z. The upper gate electrode G_U may include a first upper gate electrode G_U1 in the first memory cell array region MA1 and a second upper gate electrode G_U2 in the second memory cell array region MA2, and the first and second upper gate electrodes G_U1 and G_U2 may be spaced apart from each other, with the through hole region TH interposed therebetween, and face each other.

The lower gate electrode G_L may be the first select line (SL1 in FIG. 2) as described above with reference to FIG. 2 and the upper gate electrode G_U may be the second select line (SL2 in FIG. 2) as described above with reference to FIG. 2. Thus, as described above with reference to FIG. 2, the lower gate electrode G_L and the first select line (SL1 in FIG. 2) may be a ground select line (GSL in FIG. 1), and the upper gate electrode G_U and the second select line SL2 may be the string select line (SSL in FIG. 1). The lower gate electrode G_L may be referred to as a lower select line, and the upper gate electrode G_U may be referred to as an upper select line.

The middle gate electrodes G_M may be the word lines (WL in FIG. 2) as described above with reference to FIG. 2. In the following, the description of the middle gate electrodes G_M may be replaced with the word lines (WL in FIG. 2) to be described or understood.

Among the gate electrodes G_L, G_M, and G_U disposed on the same plane, some of the gate electrodes G_G, G_M, and G_U may be spaced apart from each other in or at the inner step region C_ST and the others may be connected to each other in or at the inner step region C_ST. For example, the upper gate electrodes G_U may be spaced apart from each other in the inner step region C_ST and the middle and lower gate electrodes G_M and G_L may be connected to each other in the inner step region C_ST (e.g., along outer sides of the inner step region C_ST, as illustrated in FIG. 4).

Main separation structures MS extending in the first direction X may be provided. The main separation structures MS may be in the form of lines parallel to each other in the plan view and may separate the gate-stack structure GS in the second direction Y. The gate-stack structure GS may be a line extending in the first direction X and may be separated by the main separation structures MS in the second direction Y. The first and second memory cell array regions MA1 and MA2 and the first and second outer step regions E_ST1 and E_ST2 may be disposed between the main separation structures MS. In an implementation, the inner step region C_ST may be disposed between the main separation structures MS.

In an implementation, in each of the first and second memory cell array regions MA1 and MA2, the memory blocks BLK such as those described above with reference to FIG. 1 may be disposed between a pair of main separation structures MS adjacent to each other. For example, the pair of main separation structures MS may serve to separate the memory blocks BLK from each other.

In an implementation, any one of the through regions TH may be disposed between a pair of main separation structures MS adjacent to each other and between the memory blocks BLK facing each other. For example, any one of the through regions TH may be formed between any one of the memory blocks BLK in the first memory cell array region MA1 and any one of the memory blocks BLK in the second memory cell array region MA2.

In an implementation, a plurality of the inner step regions C_ST may be arranged in the second direction Y on the plane. In an implementation, one inner step region C_ST may be disposed between a pair of memory blocks BLK adjacent to each other in the first direction X.

Auxiliary separation structures SS may be disposed between the main separation structures MS. The auxiliary separation structures SS may include portions arranged in order in the first direction (X). For example, the auxiliary separation structures SS may include memory isolating portions SSm traversing the first and second memory cell array regions MA1 and MA2, edge isolating portions SSe spaced apart from ends of the memory isolating portions SSm in a facing manner and disposed in the first and second outer step regions E_ST1 and E_ST2, and middle separation structures SSc spaced apart from ends of the memory isolating portions SSm in a facing manner and disposed in the inner step region C_ST. The through region TH may be disposed in the middle of the inner step region C_ST.

In the same plane between a pair of main separation structures MS adjacent to each other, a plurality of the upper gate electrodes G_U may be sequentially arranged in the second direction Y and spaced apart from each other. For example, between the pair of main separation structures MS adjacent to each other, the plurality of upper gate electrode G_U may be formed to be separated by the auxiliary separation structure SS disposed between the pair of main separation structures MS and an insulating line IL disposed between the auxiliary separation structure SS and the main separation structures MS. Here, the insulating line IL may be disposed on the middle gate electrodes G_M. The insulating line IL may be disposed in an insulating line trench (IL_T in FIG. 4) traversing the upper gate electrode G_U.

The gate-stack structure GS may have gate contact regions C_Ua, C_Ub, C_Ma, C_Mb, C_La, and C_Lb.

The gate contact regions C_Ua, C_Ub, C_Ma, C_Mb, C_La, and C_Lb may include first outer gate contact regions disposed in the first outer step region E_ST1, second outer gate contact regions disposed in the second outer step region E_ST2, and inner gate contact regions disposed in the inner step region C_ST. The gate contact regions C_Ua, C_Ub, C_Ma, C_Mb, C_La and C_Lb may include inner and outer upper contact regions C_Ua and C_Ub of the upper gate electrode G_U, inner and outer middle contact regions C-Ma and C_Mb of the middle gate electrodes G_M. and inner and outer lower contact regions C_La and C_Lb of the lower gate electrode G_L. For example, the upper gate electrode G_U may have the inner upper contact region C_Ua located in the inner step region C_ST and the outer upper contact region C_Ub located in the first and second outer step regions E_ST1 and E_ST2. The middle gate electrodes G_M may have the inner middle contact regions C_Ma located in the inner step region C_ST and the outer middle contact regions C_Mb located in the first and second outer step regions E_ST1 and E_ST2. The lower gate electrode G_L may have the inner lower contact region C_La located in the inner step region C_ST and the outer lower contact region C_Lb located in the first and second outer step regions E_ST1 and E_ST2. The inner lower contact region C_La, the inner middle contact regions C_Ma, and the inner upper contact region C_Ua may form middle steps lowered or stepping downwardly in a direction toward the through region TH. For example, the middle steps, which may be composed of the inner lower contact region C_La, the inner middle contact regions C_Ma, and the inner upper contact region C_Ua, may include steps stepping downwardly in the first direction X and steps stepping downwardly in the second direction (Y).

The outer lower contact region C_Lb, the outer middle contact regions C_Mb, and the outer upper contact region C_Ub may form edge steps arranged in a step shape. Thus, the edge steps, which may be composed of the outer lower contact region C_Lb, the outer middle contact regions C_Mb, and the outer upper contact region C_Ub, may include steps which may step downwardly in the direction X away from the first and second memory cell array regions MA1 and MA2. The inner and outer middle contact regions C_Ma and C_Mb and the inner and outer lower contact regions C_La and C_Lb may be regions that do not overlap with the gate electrode located relatively on an upper side.

Between the pair of main separation structures MS adjacent to each other, the middle gate electrodes G_M and the lower gate electrode G_L may be electrically connected on the same plane by connecting regions (IR of FIG. 4) between facing ends of the auxiliary separation structures SS, to serve as a single gate electrode. For example, in FIG. 4, the portion represented by SS_T may be auxiliary isolating trenches SS_T in which the auxiliary separation structures SS may be formed, and the aforementioned auxiliary separation structures SS may be arranged in the auxiliary isolating trenches SS_T.

Vertical channel structures VS may be disposed in the first and second memory cell array regions MA1 and MA2. The vertical channel structures VS may include first vertical channel structures VS1 disposed in the first memory cell array region MA1 and second vertical channel structures VS2 disposed in the second memory cell array region MA2. The vertical channel structures VS may be disposed on the base substrate 115 and may penetrate through the gate-stack structure GS.

The first vertical channel structures VS1 may be disposed between outer contact regions of the first outer step region E_ST1 and inner contact regions of the inner step region C_ST, and the second vertical channel structures VS2 may be disposed between gate contact regions of the second outer step region E_ST2 and inner contact regions of the inner step region C_ST.

The bit lines BL as described above with reference to FIGS. 1 and 2 may be disposed on the vertical channel structures VS. Bit line contact plugs B_P may be disposed between the bit lines BL and the vertical channel structures VS.

The gate-stack structure GS may be electrically connected to the peripheral circuit 107 in the lower structure 110.

Gate contact plugs G_Pa and G_Pb may be disposed on the gate contact regions C_Ua, C_Ub, C_Ma, C_Mb, C_La and C_Lb of the gate-stack structure GS. Peripheral contact plugs P_Pa and P_Pb may be disposed on the peripheral circuit 107.

The gate contact plugs G_Pa and G_Pb may include inner gate contact plugs G_Pa electrically connected to the peripheral circuit 107 through the through region TH and outer gate contact plugs G_Pb electrically connected to the peripheral circuit 107 through the outside of the base substrate 115.

The peripheral contact plugs P_Pa and P_Pb may include inner peripheral contact plugs P_Pa electrically connected to the peripheral circuit 107 through the through region TH and outer peripheral contact plugs P_Pb electrically connected to the peripheral circuit 107 through the outside of the base substrate 115.

Inner gate connection lines G_Ia electrically connecting the inner gate contact plugs G_Pa and the inner peripheral contact plugs P_Pa and second gate connection lines G_Ib electrically connecting the outer gate contact plugs G_Pb and the outer peripheral contact plugs P_Pb may be disposed.

The gate electrodes G_L, G_M and G_U of the gate-stack structure GS may be electrically connected to the peripheral circuit 107 by the inner and outer gate contact plugs G_Pa and G_Pb, the inner and outer peripheral contact plugs P_Pa and P_Pb, and the inner and outer gate connection lines G_Ia and G_Ib. In an implementation, a portion of the gate-stack structure GS may be electrically connected to the peripheral circuit 107 through the first and second outer step regions E_ST1 and E_ST2.

In an implementation, some of the gate-stack structures GS may be electrically connected to the peripheral circuit 107 through the inner step region C_ST.

In an implementation, a portion of the gate-stack structure GS may be connected to the peripheral circuit 107 through the first and second outer step regions E_ST1 and E_ST2 and the inner step region C_ST.

In an implementation, the upper gate electrode G_U may be electrically connected to the peripheral circuit 107 by the inner gate contact plug G_Pa on the inner upper contact region C_Ua, the inner peripheral contact plug P_Pa electrically connected to the peripheral circuit 107 through the through region TH, and the first gate connection line G_I electrically connecting the inner gate contact plug G_Pa and the inner peripheral contact plug.

In an implementation, at least some of the middle gate electrodes G_M and the lower gate electrode G_L may be electrically connected to the peripheral circuit 107 by the inner gate contact plug G_Pa on the inner middle contact region C_Ma, the inner peripheral contact plug P_Pa electrically connected to the peripheral circuit 107 through the through region TH, and the inner gate connection line G_Ia electrically connecting the inner gate contact plug G_Pa and the inner peripheral contact plug P_Pa.

In an implementation, at least some of the middle gate electrodes G_M and the lower gate electrode G_L may be electrically connected to the peripheral circuit 107 by the outer gate contact plug G_Pb on the outer middle contact region C_Mb, the outer peripheral contact plug P_Pb disposed outside base substrate 115 and electrically connected to the peripheral circuit 107, and the outer gate connection line G_Ib electrically connecting the outer gate contact plug G_Pb and the outer peripheral contact plug P_Pb.

Figure 6A:
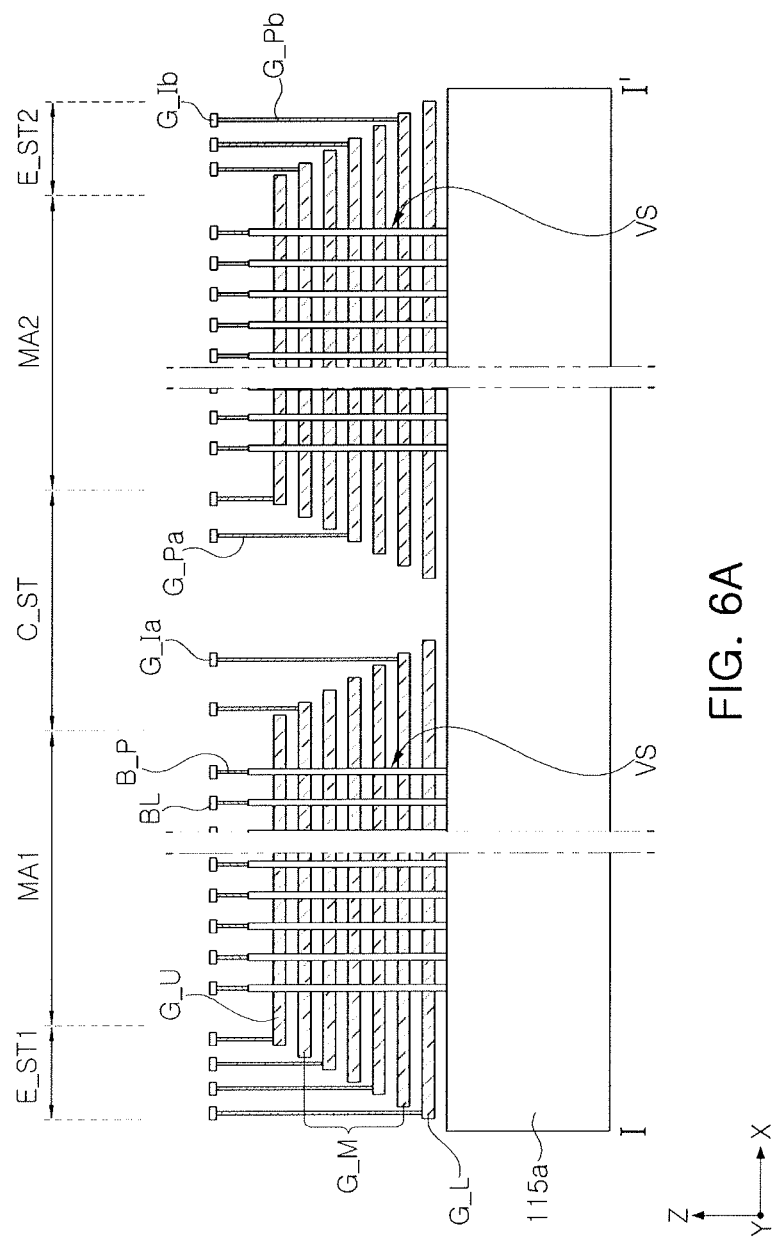
FIGS. 6A to 6C illustrate cross-sectional views of a modification of a 3D semiconductor memory device according to an example embodiment.
Figure 6B:
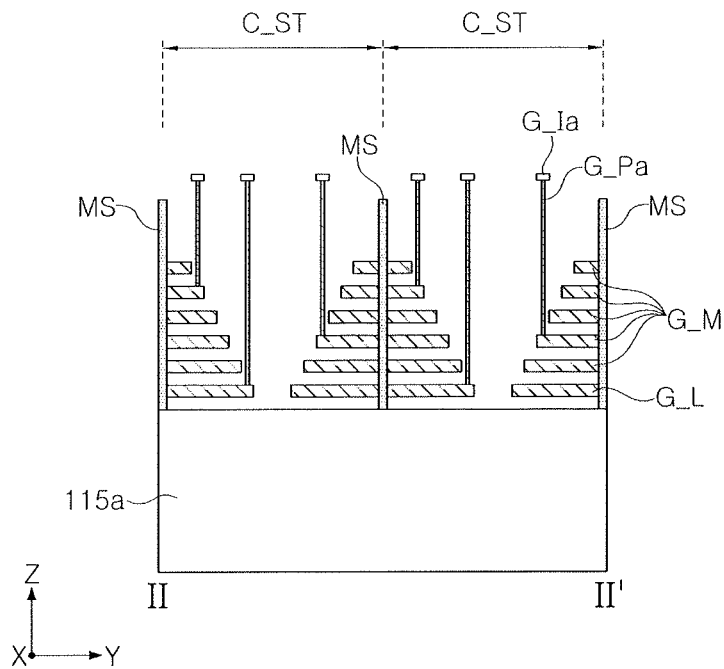
Figure 6C:
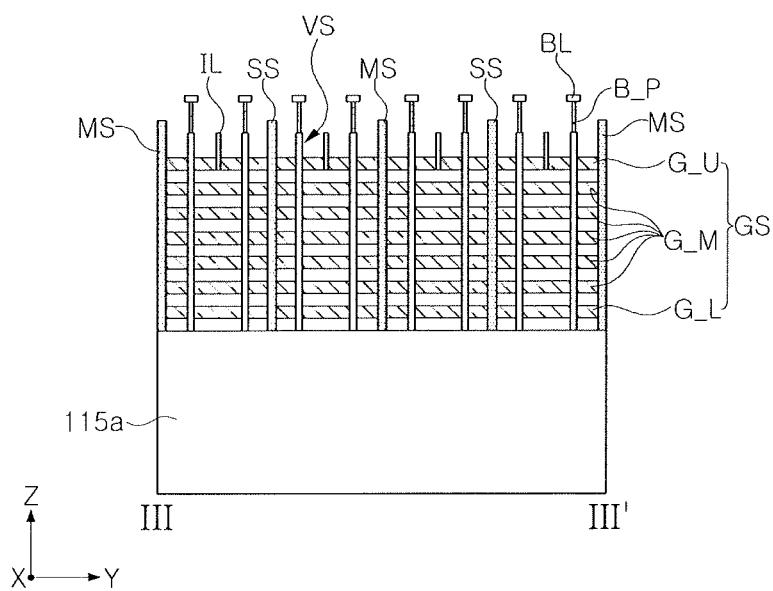

In an implementation, memory cell array regions including the first and second memory cell array regions MA1 and MA2, the inner step region C_ST, and the outer step regions E_ST1 and E_ST2 may be disposed on the base substrate 115 which may be formed of polysilicon. In an implementation, as illustrated in FIGS. 6A, 6B, and 6C, the memory cell array regions including the first and second memory cell array regions MA1 and MA2, the inner step region C_ST, and the outer step regions E_ST1 and E_ST2 may be disposed on a base substrate 115a which may be formed of single crystal silicon. FIG. 6A illustrates a cross-sectional view corresponding to FIG. 5A, FIG. 6B illustrates a cross-sectional view corresponding to FIG. 5B, and FIG. 6C illustrates a cross-sectional view corresponding to FIG. 5C.

Figure 7A:
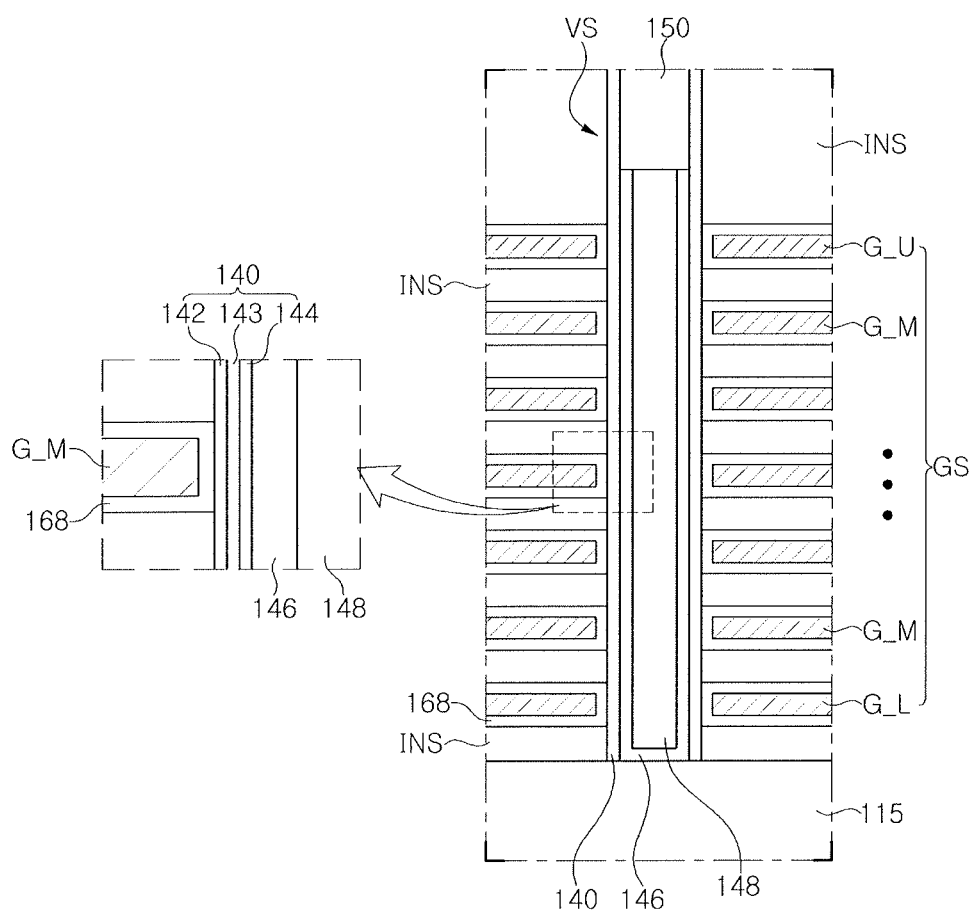
FIG. 7A illustrates a cross-sectional view of an example of a 3D semiconductor memory device according to an example embodiment.

An example of the vertical channel structures VS and an example of the gate-stack structure GS as described above with reference to FIGS. 3 to 5C will be described with reference to FIG. 7A. FIG. 7A illustrates a schematic cross-sectional view of an example of the vertical channel structures VS as described above with reference to FIGS. 3 through 5C.

Referring to FIGS. 3 through 5C and 7A, the gate-stack structure GS including the gate electrodes G_L, G_M, and G_U may be disposed on the base substrate 115 as described above.

Each of the vertical channel structures VS may penetrate through the gate-stack structure GS. The vertical channel structures VS may be disposed in channel holes (CH in FIG. 4) that penetrate through the gate-stack structure GS.

Each of the vertical channel structures VS may include an insulating core layer 148 extending in a direction perpendicular to the surface of the base substrate 115 and penetrating through the gate-stack structure GS, a channel semiconductor layer 146 covering side and bottom surfaces of the insulating core layer 148, a first gate dielectric 140 surrounding the outer side of the channel semiconductor layer 146, and a pad layer 150 disposed on the insulating core layer 148 and electrically connected to the channel semiconductor layer 146.

In an implementation, an insulating material INS may be disposed between upper and lower portions of the gate-stack structure GS and between the gate electrodes G_L, G_M, and G_U. The insulating material INS may be formed of a silicon oxide. Each of the vertical channel structures VS may penetrate through the insulating material INS through the gate-stack structure GS.

In an implementation, a second gate dielectric may be disposed between the gate electrodes G_L, G_M, and G_U and the vertical channel structures VS and disposed between the gate electrodes G_L, G_M, and G_U and insulating material INS.

The channel semiconductor layer 146 may be electrically connected to the base substrate 115. The channel semiconductor layer 146 may be formed of a semiconductor material such as silicon, or the like. The pad layer 150 may be formed of doped polysilicon having N-type conductivity. The insulating core layer 148 may be formed of an insulating material such as a silicon oxide.

Any one of the first and second gate dielectrics 140 and 168 may include a layer capable of storing data. In an implementation, the first gate dielectric 140 may include a layer capable of storing data. In an implementation, the second gate dielectric 168 may include a layer capable of storing data. Hereinafter, an example in which the first gate dielectric 140 includes a layer capable of storing data will be described.

The first gate dielectric 140 may include a tunnel dielectric 144, a data storage layer 143, and a blocking dielectric 142. The data storage layer 143 may be disposed between the tunnel dielectric 144 and the blocking dielectric 142. The tunnel dielectric 144 may be adjacent to the channel semiconductor layer 146 and the blocking dielectric 142 may be adjacent to the gate-stack structure GS.

The tunnel dielectric 144 may include a silicon oxide and/or an impurity-doped silicon oxide. The blocking dielectric 142 may include a silicon oxide and/or a high-k dielectric. The data storage layer 143 may be a layer for storing data between the channel semiconductor layer 146 and the middle gate electrodes G_M. In an implementation, the data storage layer 143 may be formed of a material, e.g., a silicon nitride, capable of trapping electrons injected from the channel semiconductor layer 146 through the tunnel dielectric 144 and retaining the electrons or erasing the electrons trapped in the data storage layer 143 according to operating conditions of a nonvolatile memory device such as a flash memory device, and the like. The second gate dielectric 168 may include a high-k dielectric (e.g., AlO, etc.).

The data storage layer 143 may store data in regions facing the middle gate electrodes G_M corresponding to the word lines (WL of FIGS. 1 and 2) described above with reference to FIGS. 1 and 2, in the gate-stack structure GS.

The regions for storing data in the data storage layer 143 in the vertical channel structure VS may be arranged in a direction perpendicular to the surface of the base substrate 155 and constitute the memory cells MC described above with reference to FIG. 2.

Figure 7B:
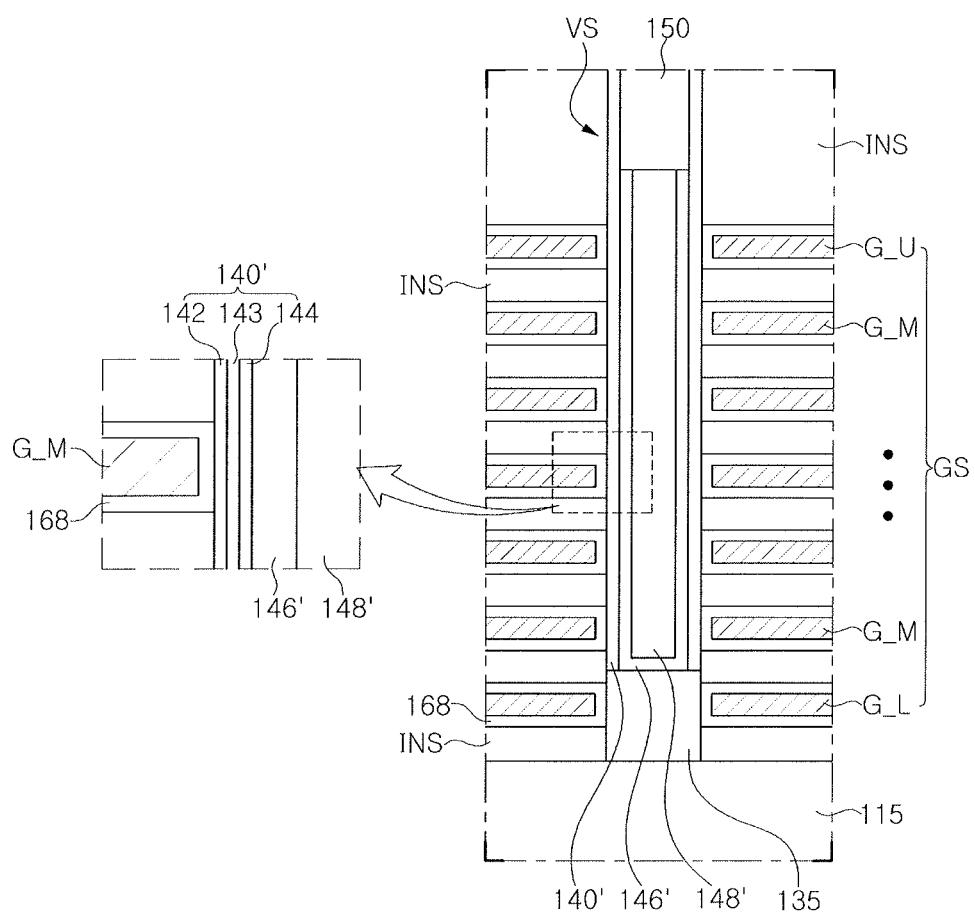
FIG. 7B illustrates a cross-sectional view of an example of a 3D semiconductor memory device according to an example embodiment.

In an implementation, the channel semiconductor layer 146 may be directly connected to the base substrate 115. A modification of the vertical channel structure VS will be described with reference to FIG. 7B. FIG. 7B illustrates a conceptual cross-sectional view for explaining a modification of the vertical channel structure in the 3D semiconductor memory device according to the example embodiment.

Referring to FIG. 7B, the vertical channel structure VS may include a lower channel semiconductor layer 135 facing the lower gate electrode G_L closest to the base substrate 115, among the gate electrodes G_L, G_M, and G_U of the gate-stack structure GS. The lower channel semiconductor layer 135 may be disposed at a level lower (e.g., closer to the base substrate 115) than the middle gate electrodes G_M.

The vertical channel structure VS may include an insulating core layer 148' on the lower channel semiconductor layer 135, an upper channel semiconductor layer 146' covering side and bottom surfaces of the insulating core layer 148', a first gate dielectric 140 surrounding an outer side of the upper channel semiconductor layer 146', and a pad layer 150 on the insulating core layer 148' and electrically connected to the upper channel semiconductor layer 146'. The lower channel semiconductor layer 135 may be directly connected to the base substrate 115 and may be formed of an epitaxial semiconductor layer. The upper channel semiconductor layer 146' may be formed of a semiconductor material such as silicon. The first gate dielectric 140' may be substantially the same as the first gate dielectric (140 of FIG. 7A) described above with reference to FIG. 7A. A second gate dielectric 168 interposed between the vertical channel structure VS' and the gate-stack structure GS and extending to an upper surface and a lower surface of the gate electrodes G_L, G_M, and G_U of the gate-stack structure GS may be disposed. Here, the second gate dielectric 168 is the same as that described above with reference to FIG. 7A.

Figure 8:
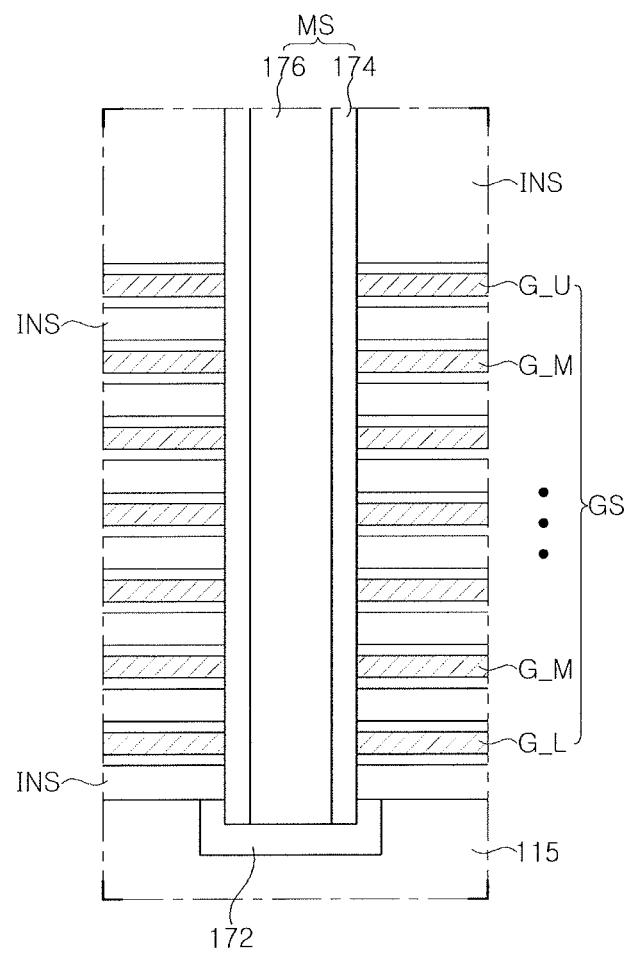
FIG. 8 illustrates a cross-sectional view of an example of a 3D semiconductor memory device according to an example embodiment.

An example of the main separation structures MS and an example of the gate-stack structure GS as described above with reference to FIGS. 3 through 5C will be described with reference to FIG. 8. FIG. 8 illustrates a schematic cross-sectional view of an example of the main separation structure MS as described above with reference to FIGS. 3 through 5C.

Referring to FIG. 8 together with FIGS. 3 through 5C, as described above with reference to FIGS. 3 through 5C, the gate-stack structure GS may include the gate electrodes G_L. G_M. and G_U and each of the main separation structures MS may penetrate through the gate electrodes G_L, G_M, and G_U of the gate-stack structure GS.

As described above with reference to FIG. 7A, the insulating material INS may be disposed on the upper and lower portions of the gate-stack structure GS and between the gate electrodes G_L, G_M, and G_U. Each of the main separation structures MS may penetrate through the gate electrodes G_L, G_M, and G_U of the gate-stack structure GS and the insulating material INS. The second gate dielectric 168 extending between the gate electrodes G_L, G_M, G_U and the insulating material INS may be disposed.

Each of the main separation structures MS may include a conductive pattern 176 and a spacer 174 covering the sides of the conductive pattern 176. The spacer 174 may be formed of an insulating material such as a silicon oxide or a silicon nitride. The spacer 174 may separate the conductive pattern 176 from the gate-stack structure GS. The conductive pattern 176 may be formed of a conductive material including at least one of doped polysilicon, a metal nitride such as titanium nitride, and a metal such as tungsten. In an implementation, the conductive pattern 176 may be referred to as a source contact plug. In an implementation, the auxiliary separation structures (SS in FIGS. 3 to 5C) may be formed of the same structure and the same material as those of the main separation structures MS.

An impurity region 172 may be positioned in the base substrate 115 below the main separation structures MS. A conductivity type of the impurity region 172 may be N-type and a conductivity type of the portion of the base substrate 115 adjacent to the impurity region 172 may be P-type. The impurity region 172 may be the common source line (CSL in FIGS. 1 and 2) described above with reference to FIGS. 1 and 2.

Figure 9A:
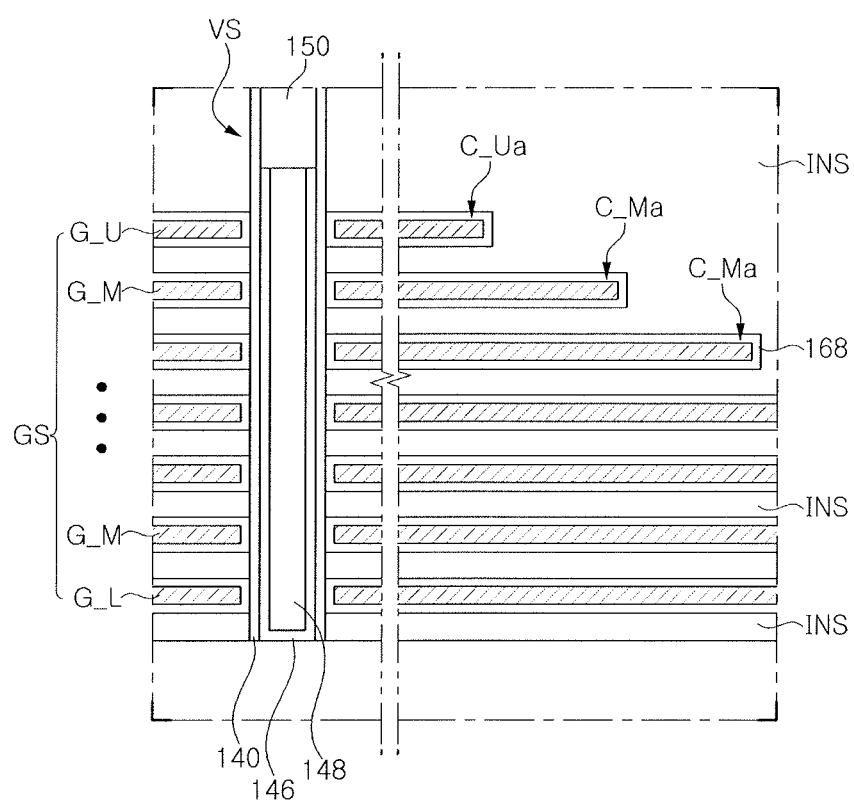
FIG. 9A illustrates a cross-sectional view of an example of a 3D semiconductor memory device according to an example embodiment.

Next, an example of the gate contact regions C_Ua, C_Ub, C_Ma, C_Mb, C_La, and C_Lb of the gate-stack structure GS described above with reference to FIGS. 3 through 5C will be describe with reference to FIGS. 7A and 9A. FIG. 9A illustrates a schematic cross-sectional view of the gate-stack structure GS together with an example of the gate contact regions C_Ua, C_Ub, C_Ma, C_Mb, C_La, and C_Lb of the gate-stack structure GS.

Referring to FIGS. 7A and 9A together with FIGS. 3 through 5C, the second gate dielectric 168, which is the same as that described in FIG. 7A, may extend to the ends of the gate electrodes G_L. GM, and G_U to cover the ends of the gate electrodes G_L, G_M, and G_U.

In an implementation, the gate contact regions C_Ua, C_Ub, C_Ma, C_Mb, C_La, and C_Lb of the gate electrodes G_L. G_M, and G_U may have the same thickness as that of the other remaining region. A modification of the thicknesses of the gate contact regions C_Ua, C_Ub, C_Ma, C_Mb, C_La, and C_Lb of the gate electrodes G_L, G_M and G_U will be described with reference to FIG. 9B.

Figure 9B:
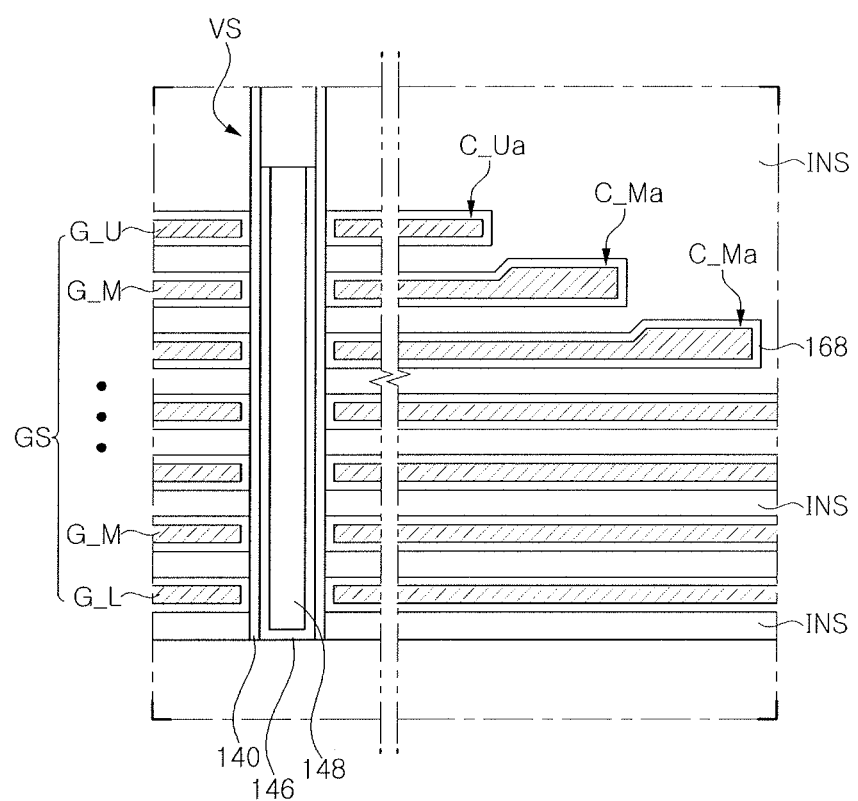
FIG. 9B illustrates a cross-sectional view of an example of a 3D semiconductor memory device according to an example embodiment.

Referring to FIG. 9B, the contact regions C_Ua and C_Ub of the upper gate electrode G_U, among the gate electrodes G_L, G_M, and G_U, may be the same as the other remaining region of the upper gate electrode G_U. The middle and lower gate electrodes G_M and G_L may have middle and lower gate contact regions C_Ma, C_Mb, C_La and C_Lb with an increased thickness. For example, the upper gate electrode G_U may be formed to have a predetermined thickness and the middle and lower gate electrodes G_M and G_L may have a thickness that is increased from the middle and lower gate contact regions C_Ma, C_Mb, C_La, and C_Lb. As such, the middle and lower gate contact regions C_Ma, C_Mb, C_La, and C_Lb having the increased thickness may help prevent a defect which could otherwise occur as the middle and the lower gate contact regions C_Ma, C_Mb, C_La, and C_Lb are penetrated by the peripheral contact plugs (P_Pa, P_Pb in FIGS. 3 through 5C) described above with reference to FIGS. 3 through 5C.

Figure 10A:
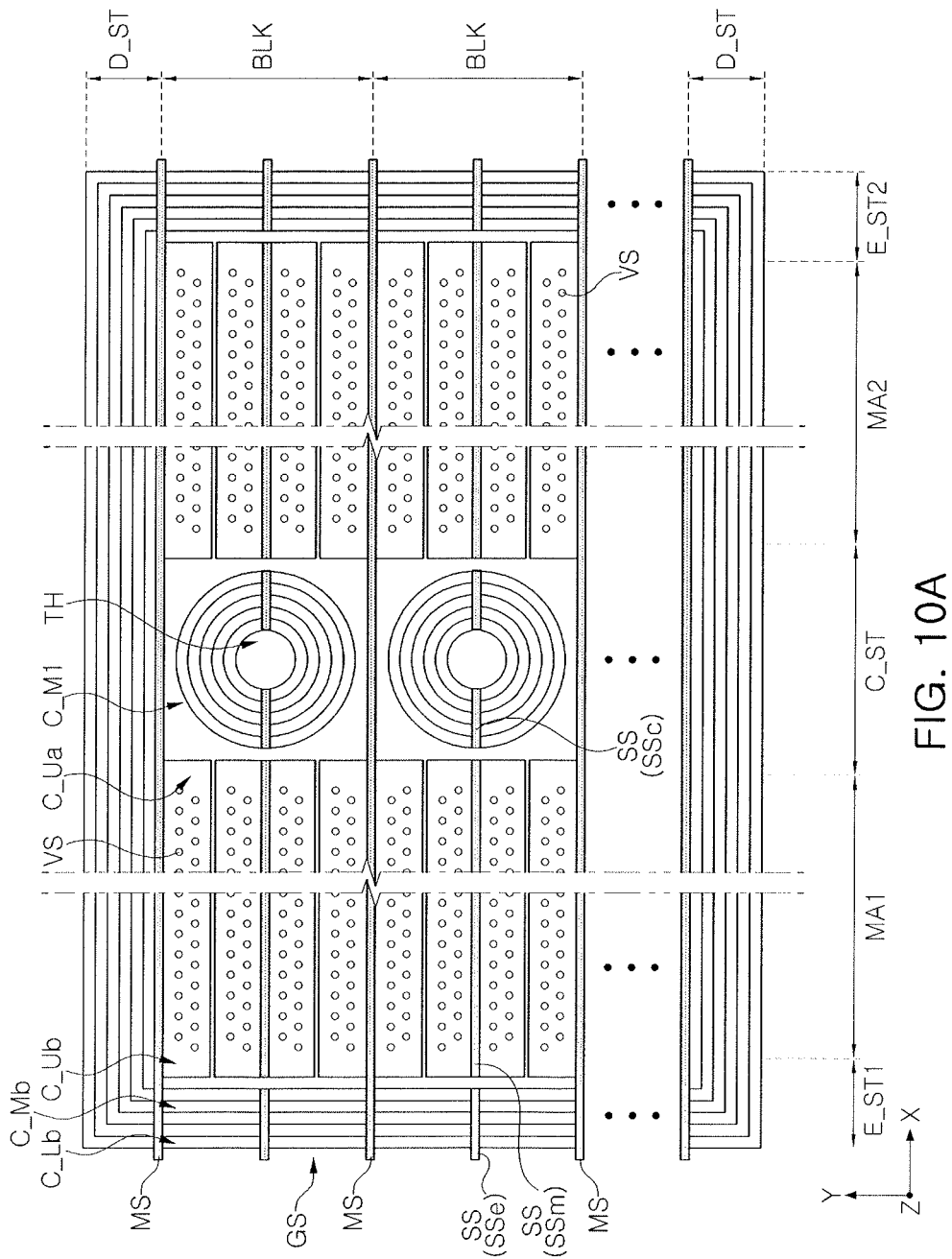
FIG. 10A illustrates a plan view of a modification of a 3D semiconductor memory device according to an example embodiment.

In an implementation, in the middle contact region C_ST described above with reference to FIGS. 3 through 5C, the first middle and lower contact regions C_Ma and C_La may have a rectangular ring shape. In an implementation, as illustrated in FIG. 10A, in the middle contact region C_ST, at least some of the contact regions C_M1 may be modified to have a circular ring shape. In an implementation, as illustrated in FIG. 10B, in the middle contact region C_ST, at least some of the contact regions C_M2 may be modified to have a polygonal ring shape (e.g. a hexagon, or the like).

Figure 10B:
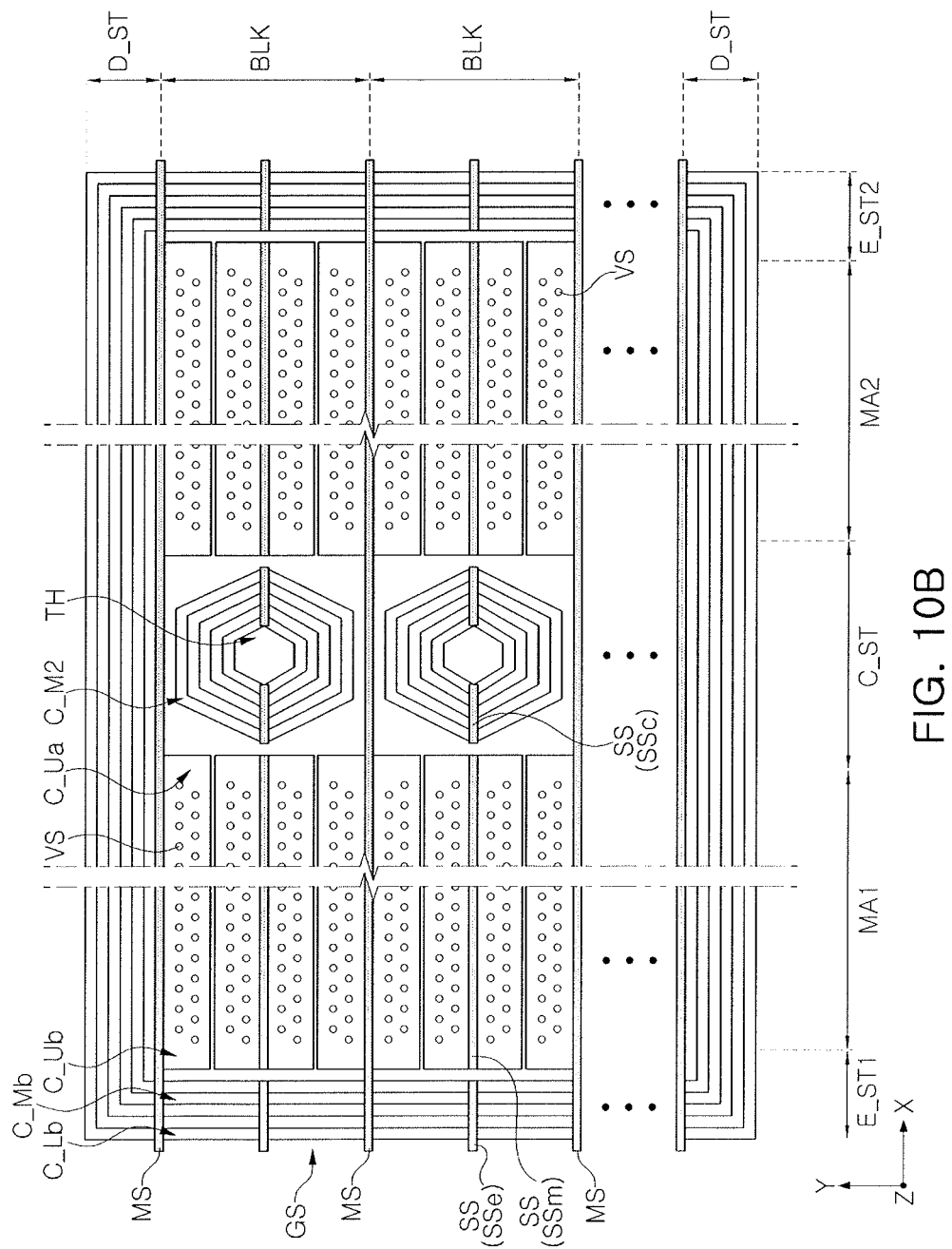
FIG. 10B illustrates a plan view of a modification of a 3D semiconductor memory device according to an example embodiment.

Here, each of FIGS. 10A and 10B illustrate plan views of a modification of some contact regions in the middle contact region C_ST.

Figure 11A:
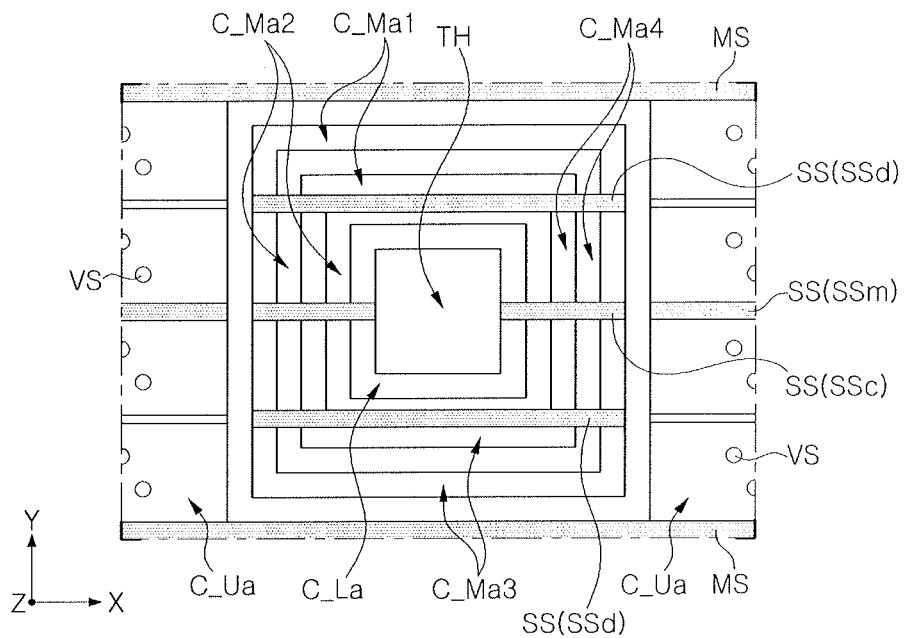
FIG. 11A illustrates a plan view of a modification of a 3D semiconductor memory device according to an example embodiment.

Next, the middle contact region C_ST described above with reference to FIGS. 3 through 5C will be described with reference to FIG. 11A. FIG. 11A illustrates a plan view of a modification of the middle contact region C_ST described above with reference to FIGS. 3 through 5C.

Referring to FIG. 11A together with FIGS. 3 through 5C, the inner middle contact regions C_Ma may include a first portion C_Ma1 and a third portion C_Ma3 facing each other in the first direction X and a second portion C_Ma2 and a fourth portion C_Ma4 facing each other in the second direction Y. The second and fourth portions C_Ma2 and C_Ma4 may be adjacent to the memory cell array regions MA1 and MA2. The first and third portions C_Ma1, C_Ma3 may be adjacent to the main separation structures MS.

In the inner middle contact regions C_Ma, a plurality of auxiliary separation structures SS, which are spaced apart from each other, may be disposed between the adjacent main separation structures MS. Here, the 'auxiliary separation structure' may also be referred to as a 'secondary separation structure'.

The plurality of auxiliary separation structures SS may be disposed on both sides of the through region TH and may include a middle auxiliary separation structure SSc traversing the second and fourth portions C_Ma2 and C_Ma4 of the inner middle contact regions C_Ma and dummy auxiliary separation structures SSd closer to the main separation structures MS than the middle auxiliary separation structure SSc.

The dummy auxiliary separation structures SSd may traverse the first and third portions C_Ma1 and C_Ma3 and traverse portions of the second and fourth portions C_Ma2 and C_Ma4.

Figure 11B:
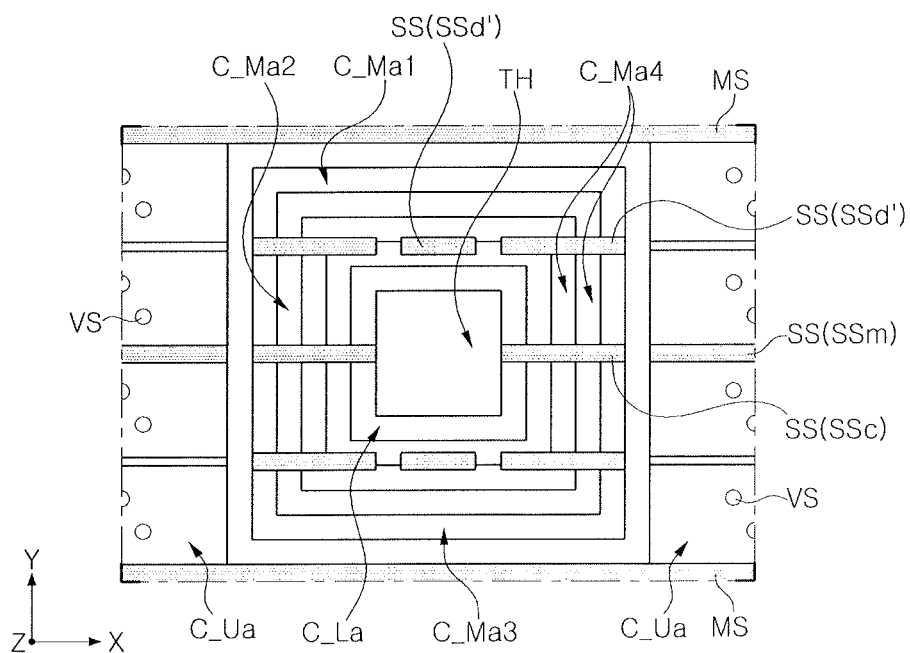
FIG. 11B illustrates a plan view of a modification of a 3D semiconductor memory device according to an example embodiment.
Figure 11C:
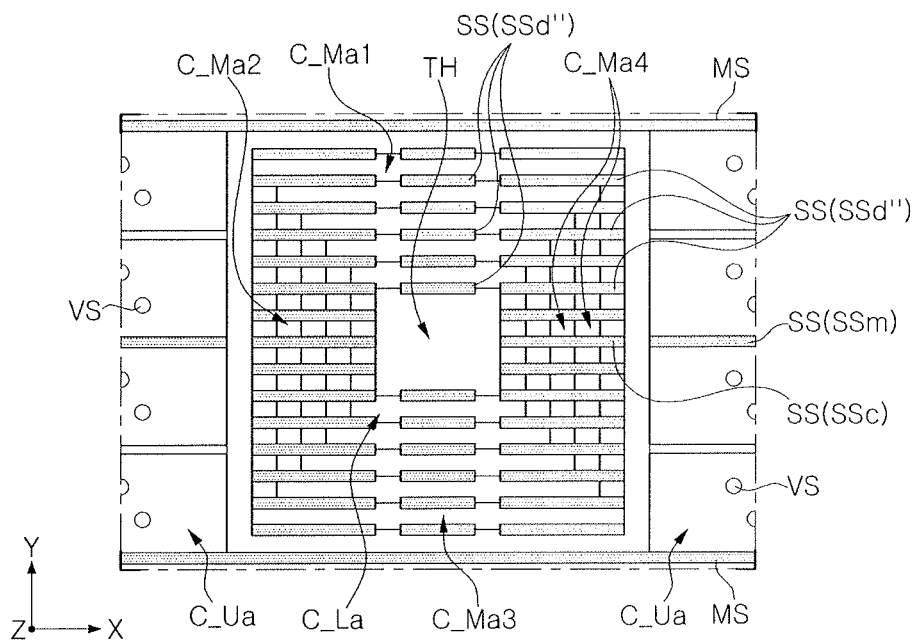
FIG. 11C illustrates a plan view of a modification of a 3D semiconductor memory device according to an example embodiment.

In an implementation, each of the dummy auxiliary separation structures SSd may have a shape of one line extending in the first direction between the memory cell array regions MA1 and MA2. Modifications of the dummy auxiliary separation structures SSd will be described with reference to FIGS. 11B and 11C, respectively. FIGS. 11B and 11C illustrate plan views respectively showing modifications of the dummy auxiliary separation structures SSd of FIG. 11A.

In an implementation, referring to FIG. 11B, dummy auxiliary separation structures SSd' may be arranged in sequence in the first direction X and may have a shape of plurality of lines spaced apart from each other in the first direction X.

In an implementation, referring to FIG. 11C, dummy auxiliary separation structures SSd" may be arranged in sequence in the first direction X, may have a shape of a plurality of lines spaced apart from each other in the first direction X, and may be arranged in parallel to each other in the second direction Y. Some of the dummy auxiliary separation structures SSd" may pass through the inner lower contact region C_La. In an implementation, the dummy auxiliary separation structures SSd" may be disposed between steps positioned on different planes in the steps arranged in the second direction Y. For example, in the steps arranged in the second direction Y, any one of the steps may be adjacent to any one of the dummy separation structures SSd". A modification of the dummy auxiliary separation structure SSd' traversing the first and third portions C_Ma1 and C_Ma3 of the inner middle contact regions C_Ma among the auxiliary separation structures SS will be described with reference to FIG. 12.

Figure 12:
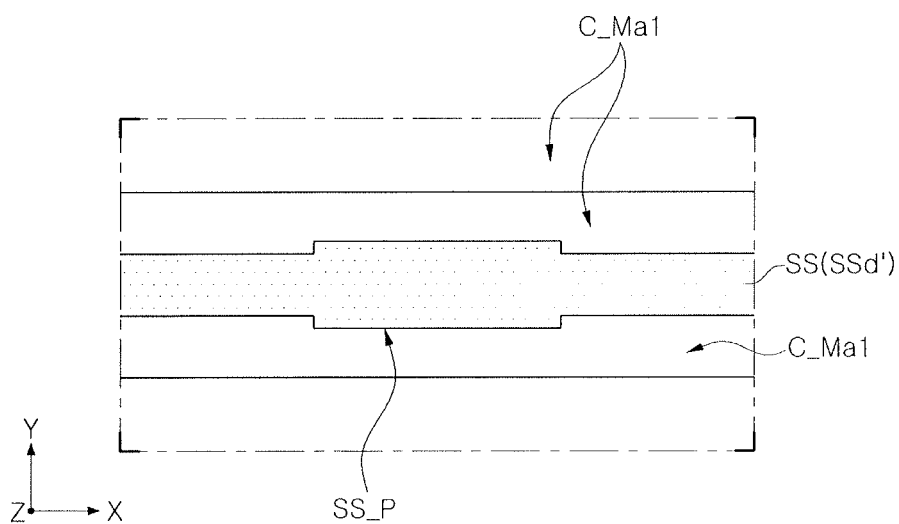
FIG. 12 illustrates a plan view of a modification of a 3D semiconductor memory device according to an example embodiment.

Referring to FIG. 12, a portion SS_P of a side surface of the dummy auxiliary separation structure SSd' may protrude in the second direction Y. For example, the dummy auxiliary separation structure SSd' may include the portion SS_P protruding in the second direction Y.

Figure 13:
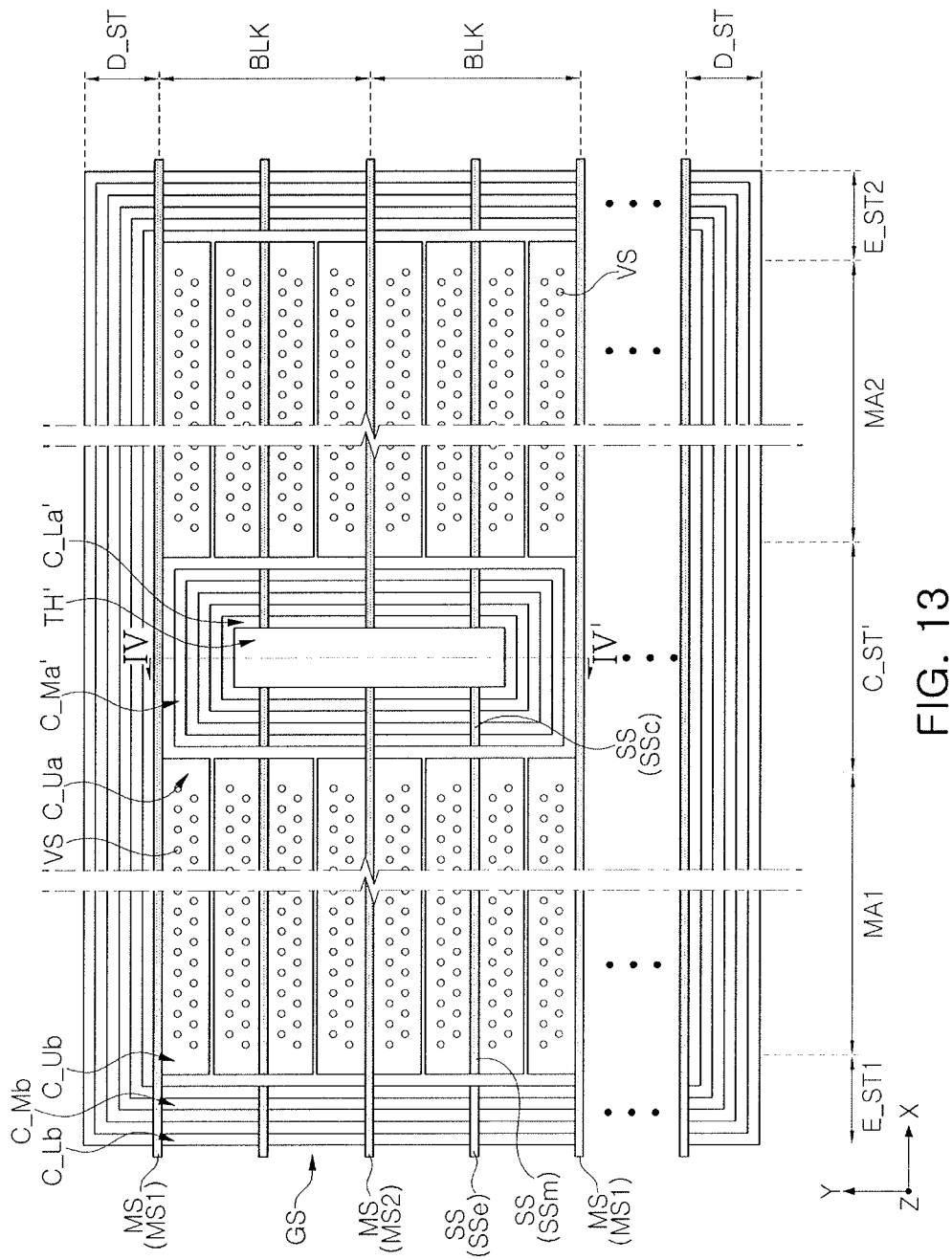
FIGS. 13 to 15 illustrate views of a modification of a 3D semiconductor memory device according to an example embodiment.
Figure 14:
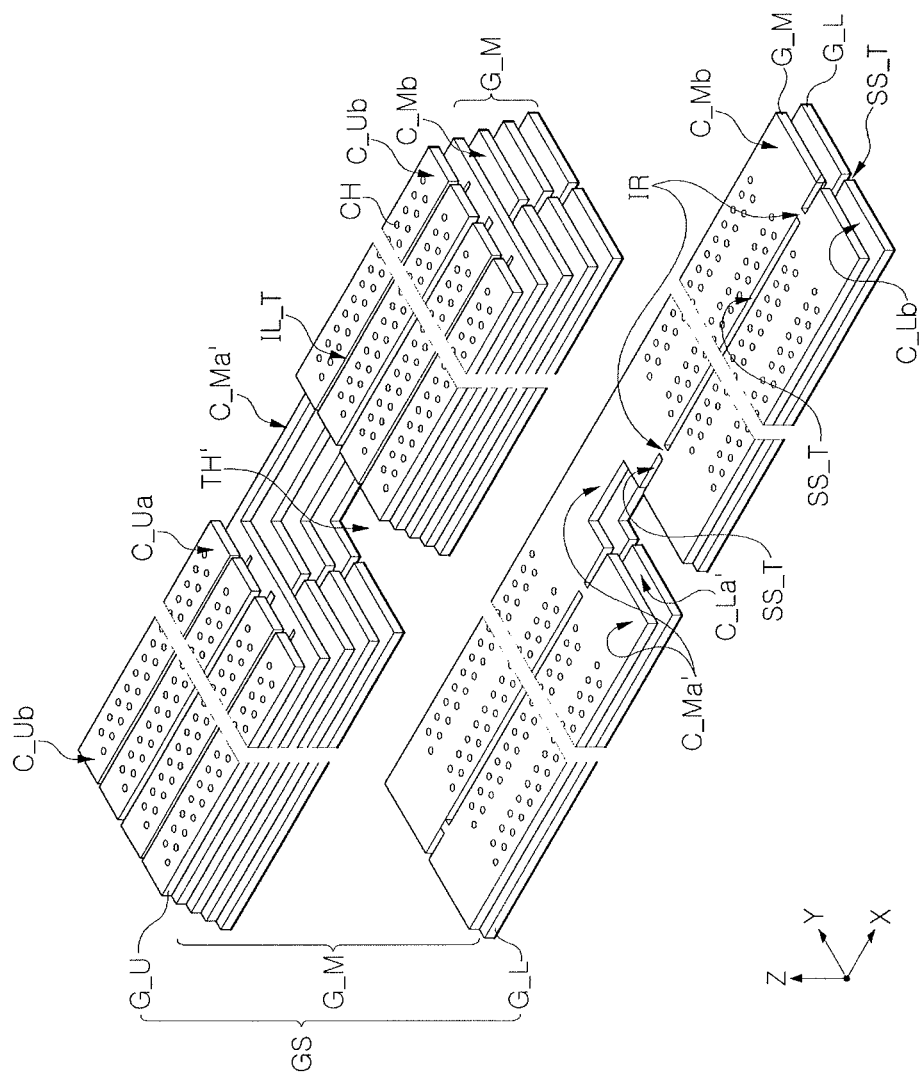
Figure 15:
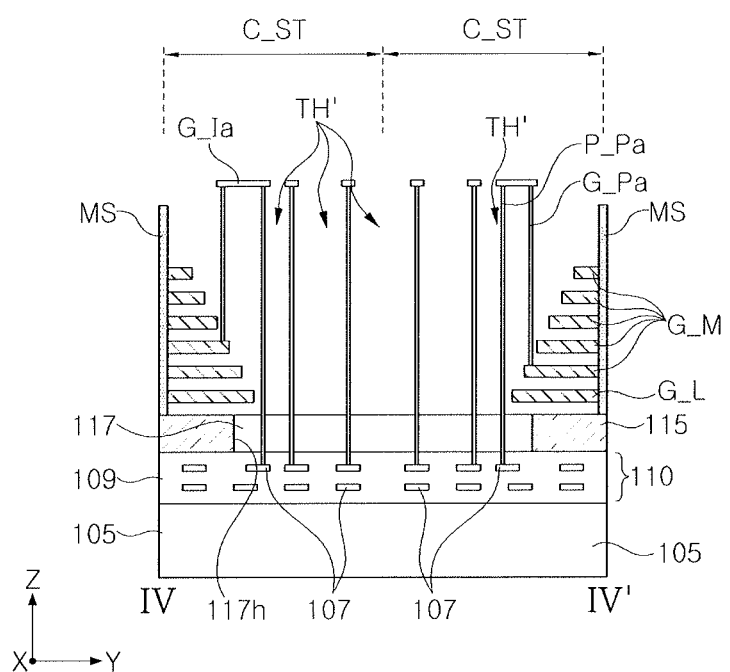

Any one of the inner step regions C_ST as described above may be disposed between a pair of memory blocks BLK sequentially arranged in the first direction X and facing each other. For example, any one of the inner step regions C_ST may be positioned between any one memory block BLK in the first memory cell array region MA1 and any one memory block BLK in the second memory cell array region MA2. Also, the through regions TH may be disposed in the inner step regions C_ST, and any one of the through regions TH may be positioned between any one memory block BLK in the first memory cell array region MA1 and any one memory block BLK K in the second memory cell array region MA2. An example in which the inner step regions C_ST and the through regions TH may be modified will be described with reference to FIGS. 13 to 15. FIG. 13 illustrates a plan view of a modification of a 3D semiconductor memory device according to an example embodiment, FIG. 14 illustrates a perspective view of a modification of a 3D semiconductor memory device according to an example embodiment, and FIG. 15 illustrates a cross-sectional view of a region taken along line IV-IV' of FIG. 13. In FIG. 13, regions corresponding to lines I-I' and of FIG. 3 are substantially the same as the cross-sectional regions of FIGS. 5A and 5C, and thus, the contents described above with reference to FIGS. 5A and 5C will be omitted. In FIGS. 13 to 15, a detailed description of the contents overlapping those described above may be omitted, and a part that may be modified in the above-described contents will be largely described. Therefore, hereinafter, the components described above will be directly cited without additional explanation.

Referring to FIGS. 13 to 15, the lower substrate 105, the lower structure 110 including the peripheral circuit 107, the base substrate 115 on the lower structure 110, and the gap fill insulating layer 117 penetrating through the base substrate 115 which are the same as those described above may be arranged. The first and second memory cell array regions MA1 and MA2 and the first and second outer step regions E_ST1 and E_ST2 which are the same as those described above may be arranged on the base substrate 115.

An inner step region C_ST' may be positioned between the first memory cell array region MA1 and the second memory cell array region MA2. The inner step region C_ST' may be positioned between the plurality of memory blocks BLK arranged in sequence in the second direction Y in the first memory cell array region MA1 and the plurality of memory cells BLK arranged in sequence in the second direction Y in the second memory cell array region MA2. Accordingly, the inner step region C_ST' may be positioned between the plurality of memory blocks BLK arranged in the first memory cell array region MA1 and the plurality of memory blocks BLK arranged in the second memory cell array region MA2. For example, the inner step region C_ST' may be positioned between two memory blocks BLK arranged in the first memory cell array region MA1 and adjacent to each other and two memory blocks BLK arranged in the second memory cell array region MA2 and adjacent to each other.

A through region TH' may be positioned in the inner step region C_ST'. The through region TH' may overlap the gap fill insulating layer 117. Like the inner step region C_ST', the through region TH' may be positioned between the plurality of memory blocks BLK in the first memory cell array region MA1 and the plurality of memory blocks BLK in the second memory cell array region MA2. For example, the through region TH' may be positioned between two memory blocks BLK arranged in the first memory cell array region MA1 and adjacent to each other and two memory blocks BLK arranged in the second memory cell array region MA2 and adjacent to each other.

The gate-stack structure GS may be positioned on the base substrate 115. The gate-stack structure GS may include a lower gate electrode G_L, middle gate electrodes G_M on the lower gate electrode G_L, and am upper gate electrode G_U on the middle gate electrodes G_M. The gate-stack structure GS located in the first and second memory cell array regions MA1 and MA2 and the first and second outer step regions E_ST1 and E_ST2 is substantially the same as that described above.

The upper gate electrode G_U may have an inner upper contact region C_Ua located in the inner step region C_ST' and may have an outer upper contact region C_Ub located in the first and second outer step regions E_ST1 and E_ST2. The middle gate electrodes G_M may have inner middle contact regions C_Ma' located in the inner step region C_ST' and may have outer middle contact regions C_Mb located in the first and second outer step regions E_ST1 and E_ST2. The lower gate electrode G_L may have an inner lower contact region C_La' located in the inner step region C_ST' and may have outer lower contact regions C_Lb located in the first and second outer step regions E_ST1 and E_ST2. The inner lower contact region the inner middle contact regions C_Ma' and the inner upper contact region C_Ua may form middle steps.

Main separation structures MS extending in the first direction X and separating the memory blocks BLK in the second direction Y may be disposed. The main separation structures MS may separate the gate-stack structure GS in the second direction Y.

The main separation structures MS may include first main separation structures MS1 and a second main separation structure MS2 between the first main separation structures MS1.

In an implementation, the inner step region C_ST' may be positioned between the first main separation structures MS1, and the second main separation structure MS2 may separate the step portion of the inner step region C_ST', while traversing the step portions of the inner step region C_ST' between the first main separation structures MS1.

In any one of the first and second memory cell array regions MA1 and MA2, any one memory block BLK may be positioned between the first main separation structure MS1 and the second main separation structures MS2.

The inner middle contact regions C_Ma' and the inner lower contact regions C_La' of the inner step region C_ST' may have a polygonal ring shape (e.g., a quadrangle or hexagon) or a circular or oval ring shape surrounding the through region TH' between a pair of memory blocks BLK in the first memory cell array region MA2 and a pair of memory blocks BLK in the second memory cell array region MA2.

The inner middle contact regions C_Ma' and the inner lower contact regions C_La' of the inner step region C_ST' may have a shape in which a polygonal ring such as a quadrangle or a hexagon is cut in half or a shape in which a circular or oval ring is cut in half between one memory block BLK in the first memory cell array region MA1 and one memory block BLK in the second memory cell array region MA2. For example, the inner middle contact regions C_Ma' and the inner lower contact regions C_La' of the inner step region C_ST' may have a "C" shape between one memory block BLK in the first memory cell array region MA1 and one memory block BLK in the second memory cell array region MA2. In the same plane, the through region TH' may be surrounded by two middle gate electrodes G_M, i.e., two word lines WL.

Between one memory block BLK in the first memory cell array region MA1 defined between the first main separation structure MS1 and the second main separation structure MS2 and one memory block BLK in the second memory cell array region MA2, the inner middle contact regions C_Ma' may include a step portion adjacent to the first main separation structure MS1 and stepping downwardly in the second direction away from the first main separation structure MS1 and step portions stepping downwardly in a direction toward the through region TH' from the first and second memory cell array regions MA1 and MA2 in a region adjacent to the first and second memory cell array regions MA1 and MA2.

At least some of the contact regions C_Ua, C_Ma and C_La of the gate-stack structure GS in the inner middle contact regions C_Ma' may be electrically connected to the peripheral circuit 107 through the through region TH'. For example, an inner gate contact plug G_Pa electrically connected to at least some of the contact regions C_Ua, C_Ma and C_La of the gate-stack structure GS in the inner middle contact regions C_Ma', an inner peripheral contact plug P_Pa extending through the through region TH' to pass through the gap fill insulating layer 117 so as to be electrically connected to the peripheral circuit 107, and an inner gate connection line G_Ia for electrically connecting the inner peripheral contact plug P_Pa and the inner gate contact plug G_Pa may be disposed.

Figure 16A:
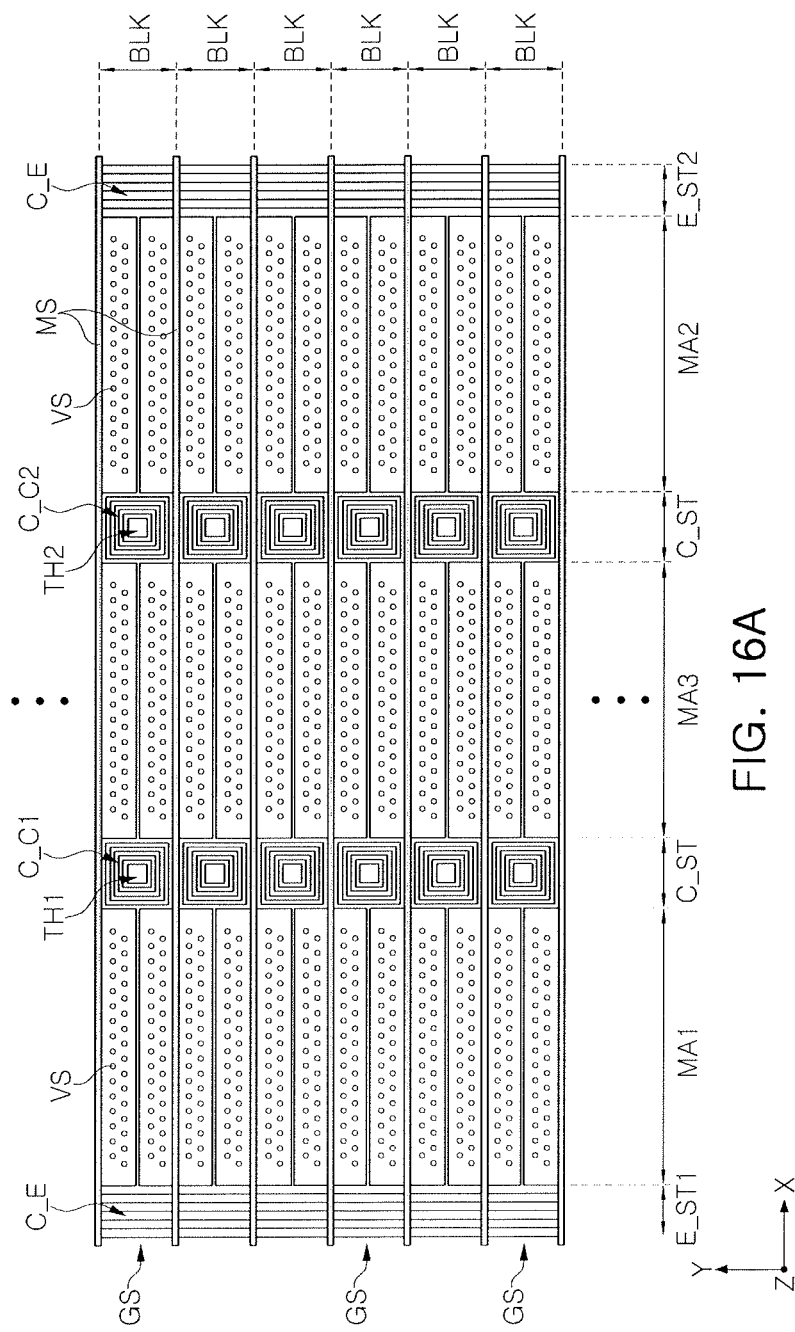
FIG. 16A illustrates a plan view of a modification of a 3D semiconductor memory device according to an example embodiment.

In an implementation, the first and second memory cell array regions MA1 and MA2 may be arranged in the first direction X are described above. An example in which one or a plurality of memory cell array regions are disposed between the first and second memory cell array regions MA1 and MA2 will be described with reference to FIGS. 17A, 17B, and 17C together with FIGS. 13 through 15. In FIGS. 16A to 17C, each of FIGS. 16A and 17A illustrate a schematic plan view of a modification of a semiconductor device according to the example embodiment, and each of FIGS. 16B, 16C. 17B, and 17C illustrate a schematic perspective view of an electrical connection relationship of any one gate electrode. Hereinafter, a detailed description of the contents overlapping those described above may be omitted and part that may be modified in the contents described above will be largely described. Therefore, hereinafter, the components described above will be directly cited without additional explanation.

Figure 16B:
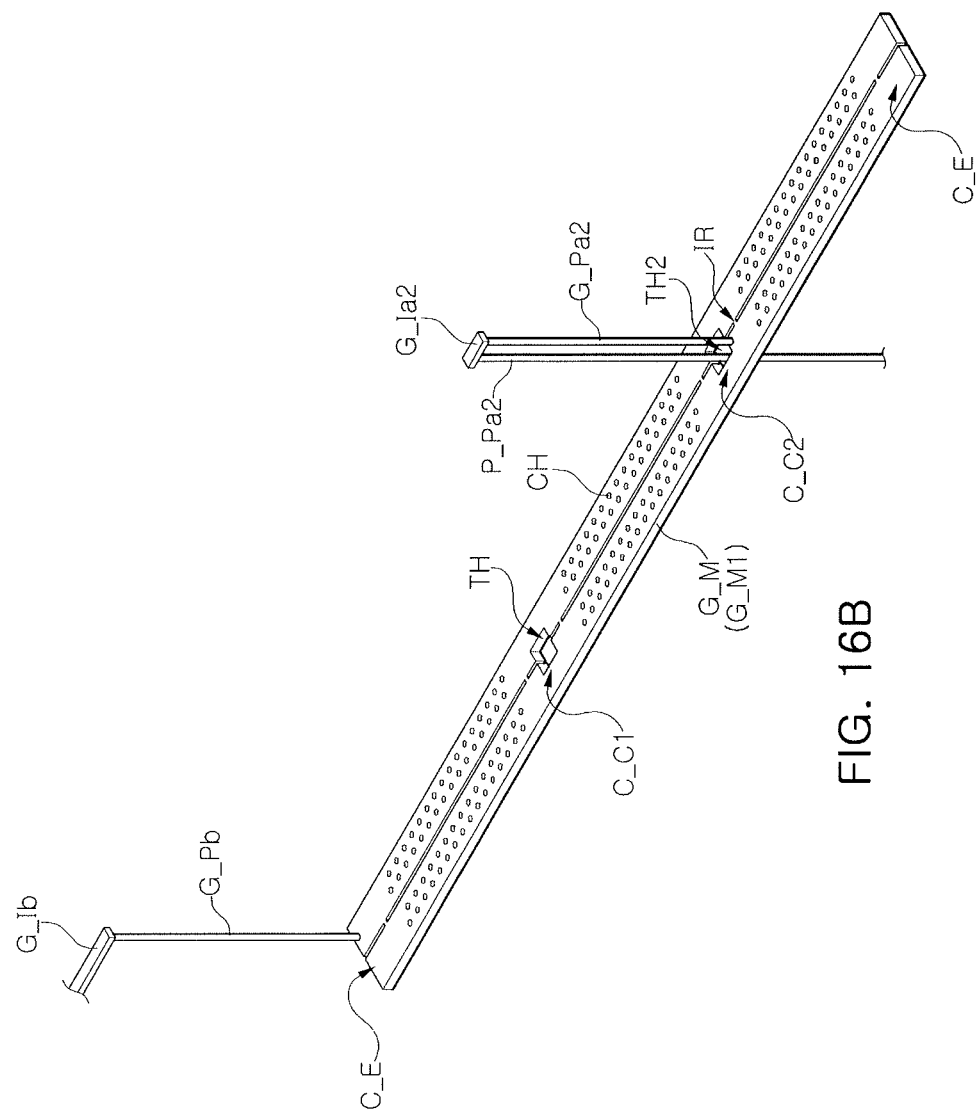
FIG. 16B illustrates a perspective view of a modification of a 3D semiconductor memory device according to an example embodiment.
Figure 16C:
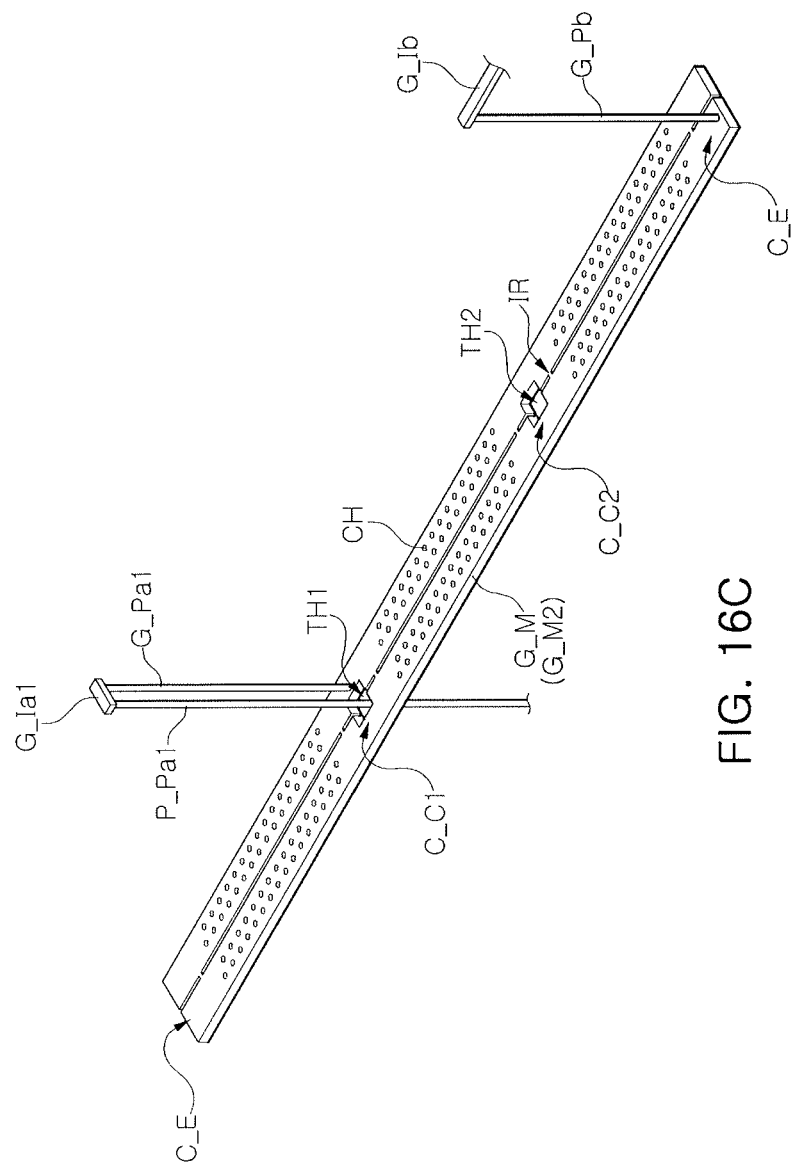
FIG. 16C illustrates a perspective view of a modification of a 3D semiconductor memory device according to an example embodiment.
Figure 17A:
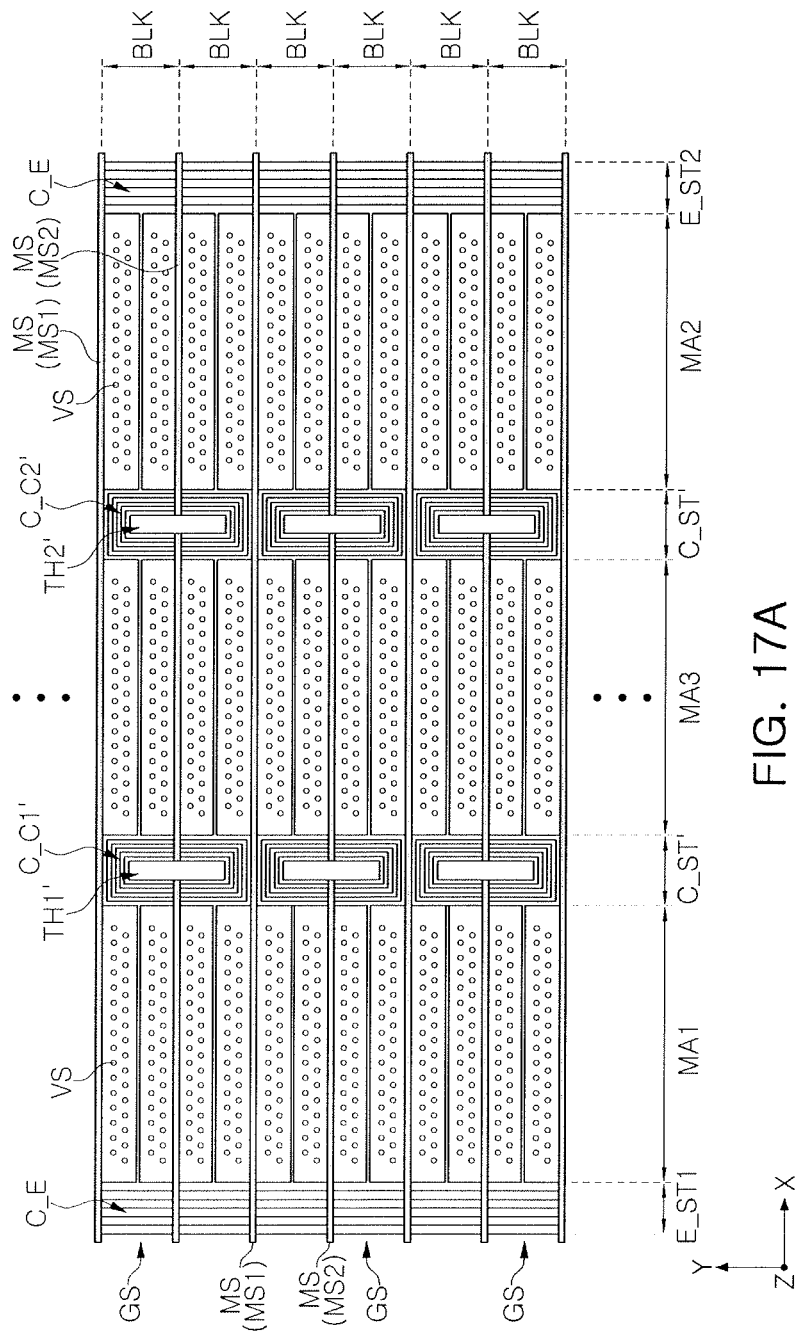
FIG. 17A illustrates a plan view of a modification of a 3D semiconductor memory device according to an example embodiment.

Referring to FIGS. 16A to 16C together with FIGS. 3 through 5C, according to an example embodiment, the plurality of memory cell array regions may be disposed on the base substrate 115 and the first and second outer step regions E_ST1 and E_ST2 facing each other with the plurality of memory cell array regions interposed therebetween may be disposed as described above with reference to FIGS. 3 through 5C. The plurality of inner step regions C_ST may be disposed between the plurality of memory cell array regions. A third memory cell array region MA3 may be disposed between the first memory cell array region MA1 and the second memory cell array region MA2. The third memory cell array regions MA3 may be arranged in plural.

The inner step regions C_ST may be disposed between the first memory cell array region MA1 and the third memory cell array region MA3 and between the third memory cell array region MA3 and the second memory cell array region MA2. Each of the inner step regions C_ST may be positioned between one memory block BLK and another memory block BLK arranged in the first direction X.

The edge steps C_E in the first and second outer step regions E_ST1 may include the outer lower contact region C_Lb, the outer middle contact regions C_Mb, and the outer upper contact region C_Ub as described above with reference to FIGS. 3 through 5C.

Each of the first and second middle steps C_C1 and C_C2 in the inner step regions C_ST may include the inner lower contact region C_La, the inner middle contact regions C_Ma, and the inner upper contact region C_Ua described above with reference to FIGS. 3 through 5C.

On the plane, first and second through regions TH1 and TH2 surrounded by the first and second middle steps C_C1 and C_C2 may be arranged. Each of the first and second through regions TH1 and TH2 may correspond to the through region TH described above with reference to FIGS. 3 through 5C.

In order to explain an electrical connection relationship of the middle gate electrodes G_M, any one first middle gate electrodes G_M1 and another second middle gate electrodes G_M2, among the middle gate electrodes G_M, will be mainly described.

Channel holes CH penetrating through the first and second middle gate electrodes G_M may be disposed. The channel holes CH may be filled with the vertical channel structures VS.

The first through region TH1 and the second through region TH2 may penetrate through the first and second middle gate electrodes G_M1 and G_M2. The first through region TH1 may be surrounded by the first middle step C_C1 of the first and second middle gate electrodes G_M, and the second through region TH2 may be surrounded by the second middle step C_C2 of the first and second middle gate electrodes G_M. The first and second middle gate electrodes G_M1 and G_M2 may have the edge steps C_E disposed at both ends thereof. The first and second middle steps C_C1 and the edge steps C_E of the first and second middle gate electrodes G_M1 and G_M2 may be gate contact regions.

In the first middle gate electrode G_M1, the first inner gate contact plug G_Pa1 may be positioned on the first middle step C_C1, and the outer gate contact plug G_Pb may be disposed on any one step among the edge steps C_E.

In the second middle gate electrode G_M2, the second inner gate contact plug G_Pa2 may be positioned on the second middle step C_C2, and the outer gate contact plug G_Pb may be positioned on any one step among the edge steps C_E. The outer gate contact plugs G_Pb may be electrically connected to the peripheral circuit 107 through the outer gate connection line G_Ib and the outer peripheral contact plug P_Pb such as those described above with reference to FIG. 5A.

In the first middle gate electrode G_M1, the first inner peripheral contact plug P_Pa1 passing through the first through region TH1 may be positioned, and in the second middle gate electrode G_M2, the second inner peripheral contact plug P_Pa2 passing through the second through region TH2 may be positioned.

The first and second inner peripheral contact plugs P_Pa1 and P_Pa2 may be electrically connected to the peripheral circuit 107 described above with reference to FIGS. 3 through 5, through the first and second through regions TH1 and TH2.

The first inner gate connection line G_Ia1 may be positioned on the first inner peripheral contact plug P_Pa1 and the first inner gate contact plug G_Pa1, and the second inner gate connection line G_Ia2 may be positioned on the second inner peripheral contact plug P_Pa1 and the second inner gate contact plug G_Pa2.

The first and second middle gate electrodes G_M1 and G_M2 may be electrically connected to the peripheral circuit 107 through at least one of the first and second middle steps C_C1 and the edge steps C_E.

The first and second middle gate electrodes G_M1 and G_M2 may be electrically connected to the peripheral circuit 107 through at least two of the first and second middle steps C_C1 and the edge steps C_E. For example, deterioration of gate voltage scattering characteristics that could otherwise occur due to an increase in length of the middle gate electrode G_M in the first direction X may be prevented.

Figure 17B:
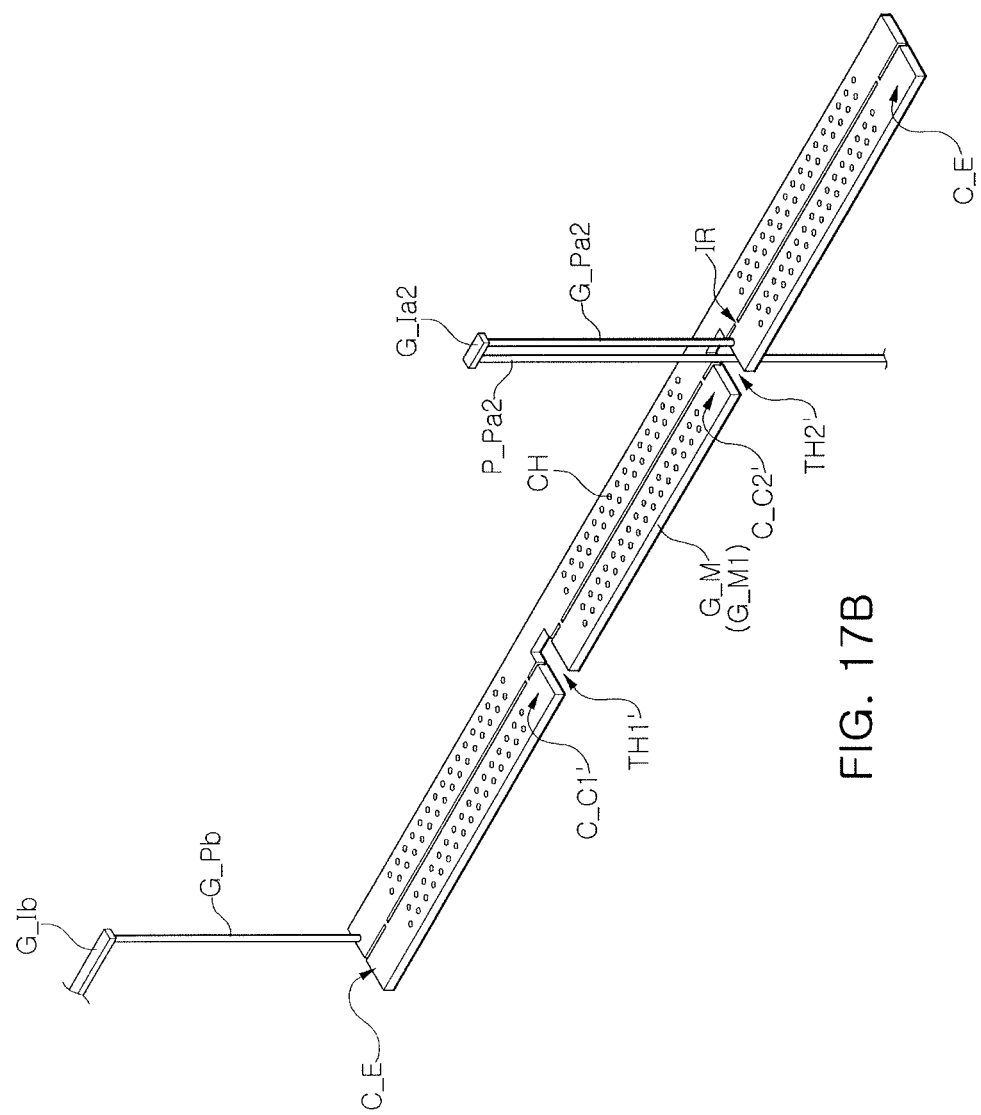
FIG. 17B illustrates a perspective view of a modification of a 3D semiconductor memory device according to an example embodiment.
Figure 17C:
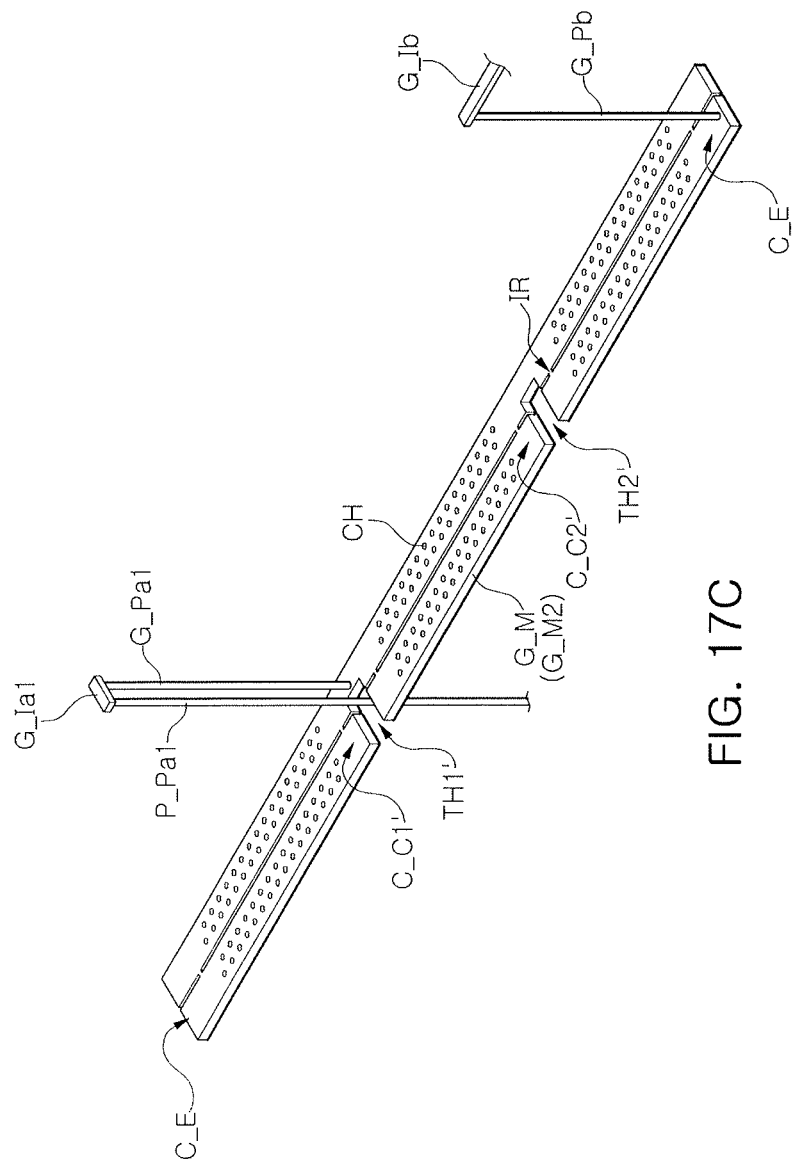
FIG. 17C illustrates a perspective view of a modification of a 3D semiconductor memory device according to an example embodiment.

Next, referring to FIGS. 17A through 17C together with FIGS. 13 through 15, each of the inner step regions C_ST described above with reference to FIGS. 16A to 16C may be modified to the inner step regions C_ST' having a shape illustrated in FIGS. 17A to 17C. Each of the modified inner step regions C_ST' may correspond to the inner step region C_ST' described above with reference to FIGS. 13 through 15. For example, each of the first and second middle steps C_C1' and C_C2' in the inner step regions C_ST' may be configured as the inner lower contact region C_La', the inner middle contact regions C_Ma', and the inner upper contact region C_Ua described above with reference to FIGS. 13 through 15.

The first and second through regions TH1' and TH2' surrounded by the first and second middle steps C_C1' and C_C2' may be disposed. Each of the first and second through regions TH1' and TH2' may correspond to the through region TH' described above with reference to FIGS. 13 through 15.

For example, the first and second middle gate electrodes G_M1 and G_M2 as illustrated in FIGS. 17B and 17C are the same as the first and second middle gate electrodes G_M1 and G_M2 described above with reference to FIGS. 16B and 16C and may be electrically connected to the peripheral circuit 107 described above with reference to FIGS. 3 through 5C.

In an implementation, the inner step regions C_ST' may be disposed between the plurality of memory cell array regions. The plurality of memory cell array regions may be sequentially arranged in the first direction X. When the plurality of memory cell array regions include the first memory cell array region MA1, the second memory cell array region MA2, and the third memory cell array region MA3 between the first and second memory cell array regions MA1 and MA2, the inner step regions C_ST' may be arranged in plural, sequentially in the second direction Y between the first and third memory cell array regions MA1 and MA3 and may be arranged in plural, sequentially in the second direction Y between the second and third memory cell array region MA2 and MA3. In this manner, any one of the inner step regions C_ST' sequentially arranged in the second direction Y may be positioned between the plurality of memory blocks BLK and the plurality of memory blocks BLK. The first and second through regions TH1' and TH2' may be disposed in the inner step regions C_ST', and any one of the through regions TH1' and TH2' may be positioned between the plurality of memory blocks BLK and the plurality of memory blocks BLK, like the inner step regions C_ST'. Similarly, any one of the first and second middle steps C_C1' and C_C2' may be positioned between the plurality of memory blocks BLK and the plurality of memory blocks BLK. For example, any one of the inner step regions C_ST', any one of the first and second through regions TH1' and TH2', and any one of the first and second middle steps C_C1', C_C2' may be positioned between two memory blocks BLK and two memory blocks BLK.

In an implementation, the inner step regions C_ST' may be disposed between the first main separation structures MS1. The second main separation structure MS2 may traverse the step portions of the inner step regions C_ST' between the first main separation structures MS1 to separate the step portions of the inner step regions C_ST'. For example, the inner step regions C_ST' may be arranged in sequence in a virtual straight line in the first direction X. In an implementation, the method of arranging the inner step regions C_ST' may be modified. A modification of an arrangement of the inner step regions C_ST' will be described with reference to FIG. 18.

Figure 18:
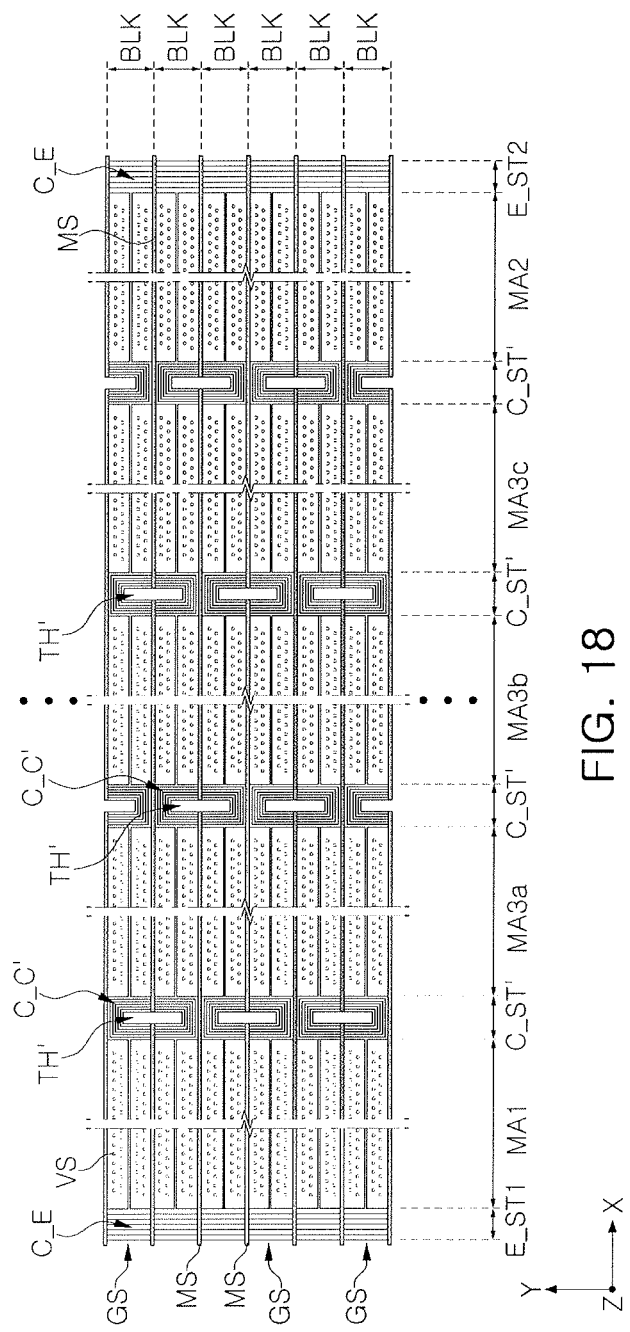
FIG. 18 illustrates a plan view of a modification of a 3D semiconductor memory device according to an example embodiment.

In an implementation, referring to FIG. 18, a plurality of memory cell array regions may be arranged in the first direction X as described above. For example, the plurality of memory cell array regions MA arranged in sequence in the first direction X may include the first and second memory cell array regions MA1 and MA2 and a plurality of third memory cell array regions MA3a, MA3b, and MA3c disposed between the first and second memory cell array regions MA1 and MA2. The inner step region C_ST' in FIG. 13 described above may be arranged in plural. For example, the plurality of inner step regions C_ST' may be arranged in sequence in the second direction Y between two adjacent memory cell array regions among the plurality of memory cell array regions MA. For example, the plurality of inner step regions C_ST' may be arranged in zigzags in the first direction X between the plurality of memory cell array regions MA arranged in the first direction X.

The through region TH' described above with reference to FIG. 13 may be positioned in each of the plurality of inner step regions C_ST'. The through region TH' may be disposed in plural, like the plurality of inner step regions C_ST'. For example, the plurality of through-holes TH' may be arranged in sequence in the second direction Y between two adjacent memory cell array regions, among the plurality of memory cell array regions MA and may be arranged in zigzags in the first direction X between the plurality of memory cell array regions MA arranged in the first direction X.

Any one of the main separation structures MS described above may extend in a straight line in the first direction X to extend while passing between two inner step regions arranged in the second direction Y, among the plurality of inner step regions C_ST', and may extend to the middle of another inner step region positioned in the first direction X from between the two inner step regions.

Figure 19:
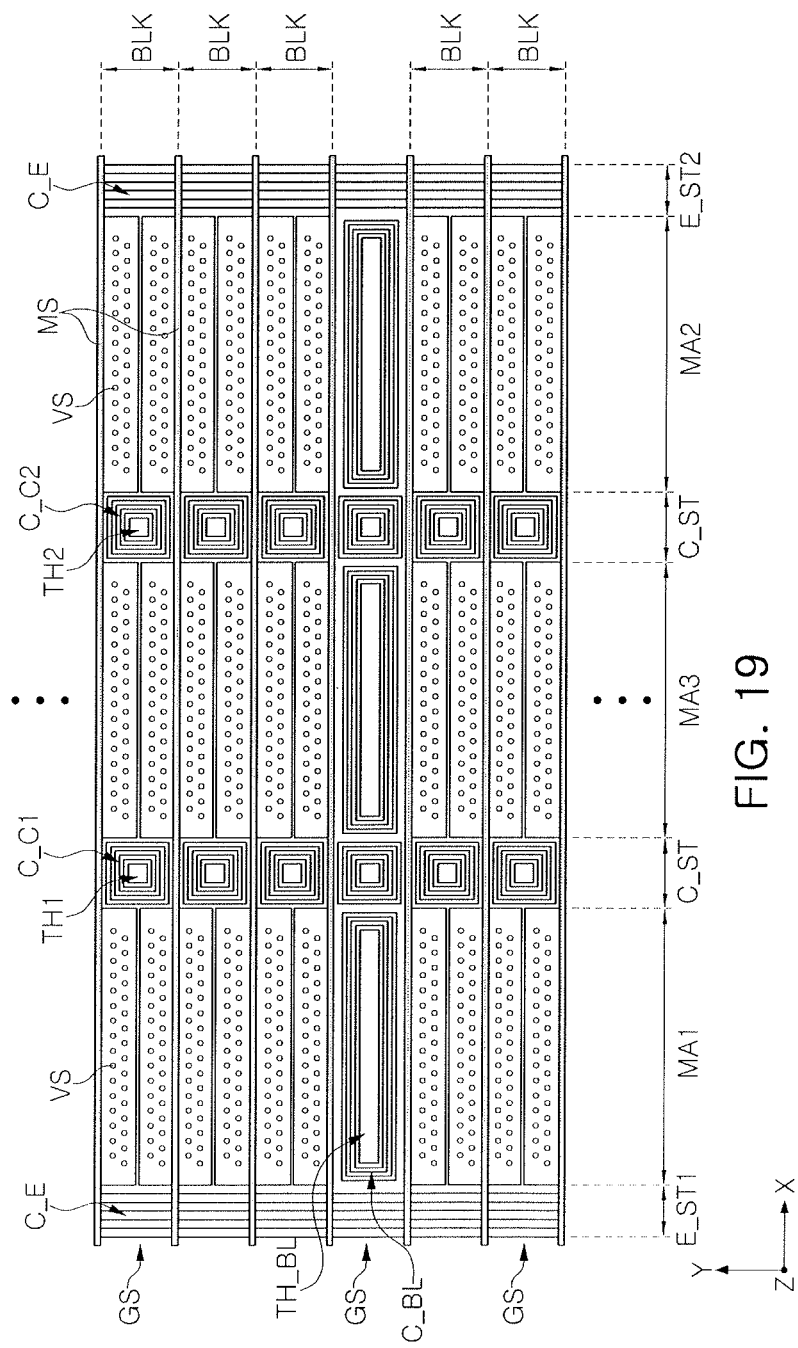
FIG. 19 illustrates a plan view of a modification of a 3D semiconductor memory device according to an example embodiment.
Figure 20:
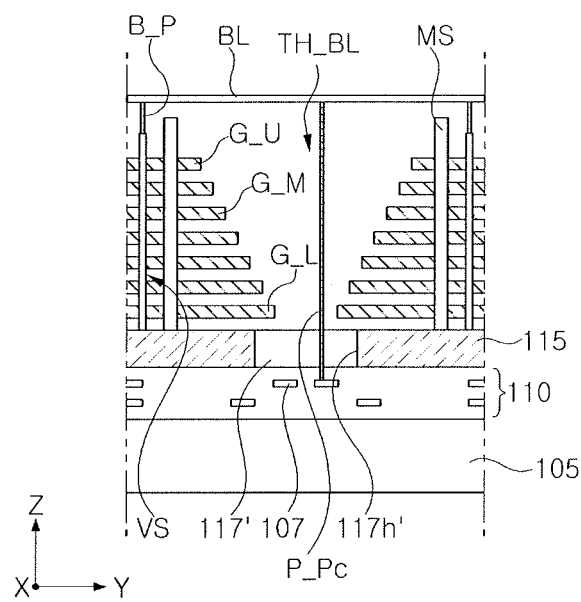
FIG. 20 illustrates a cross-sectional view of a modification of a 3D semiconductor memory device according to an example embodiment.

FIGS. 3 through 18 illustrate examples in which the gate electrodes G_L, G_M, and G_U are electrically connected to the peripheral circuit 107. In an implementation, in addition to the examples of electrically connecting the gate electrodes G_L, G_M, and G_U described in FIGS. 3 to 18 to the peripheral circuit 107, an example of electrically connecting the bit lines BL electrically connected to the vertical channel structures VS described in FIGS. 3 through 18 to the peripheral circuit 107 will be described with reference to FIGS. 19 and 20. In FIGS. 19 and 20, FIG. 19 illustrate a plan view of an example of a 3D semiconductor memory device according to an example embodiment, and FIG. 20 illustrates a cross-sectional view taken along line V-V' of FIG. 19. Hereinafter, a detailed description of the contents overlapping those described with reference to FIGS. 13 through 18 may be omitted, and elements of the contents described above that may be modified will mainly be described. Hereinafter, the components described above with reference to FIGS. 3 through 18 will be directly cited without additional explanation, and an example of electrically connecting the bit lines BL to the peripheral circuit 107 will be described with reference to FIGS. 20 and 21 together with FIGS. 3 through 18.

Referring to FIGS. 19 and 20 together with FIGS. 3 to 18, a bit line through region TH_BL, may be positioned between the memory blocks BLK arranged in the first direction X. Therefore, the bit line through region TH_BL may penetrate through the gate-stack structure GS in the first and second memory cell array regions MA1 and MA2.

The bit line through region TH_BL may be between the main separation structures MS described above. The bit line BL as described above may be electrically connected to the vertical channel structures VS through the bit line contact plugs B_P.

A bit line gap fill insulating layer 117' that overlaps the bit line through region TH_BL and fills a hole 117h' penetrating through the base substrate 115 may be positioned.

A bit line peripheral contact plug P_Pc may extend to the peripheral circuit 107 through the bit line through region TH_BL and the bit line gap fill insulating layer 117'.

The bit line BL may be electrically connected to the bit line peripheral contact plug P_Pc and the bit line contact plug B_P. Accordingly, the vertical channel structures VS may be electrically connected to the peripheral circuit 107 between the base substrate 115 and the lower substrate 100 via the bit line contact plugs B_P, the bit line BL, and the bit line peripheral contact plugs P_Pc.

Next, the above-described steps may be modified and arranged in various shapes. Hereinafter, examples of steps will be described with reference to FIGS. 21, 22A, 22B, 23A, and 23B. Hereinafter, in describing the example of the steps with reference to FIGS. 21, 22A, 22B, 23A and 23B, the other components of the 3D semiconductor memory device may be understood with the contents described above with reference to FIGS. 1 through 20, and thus, contents other than the steps may be described by directly citing the components described above, without additional explanation.

Figure 21:
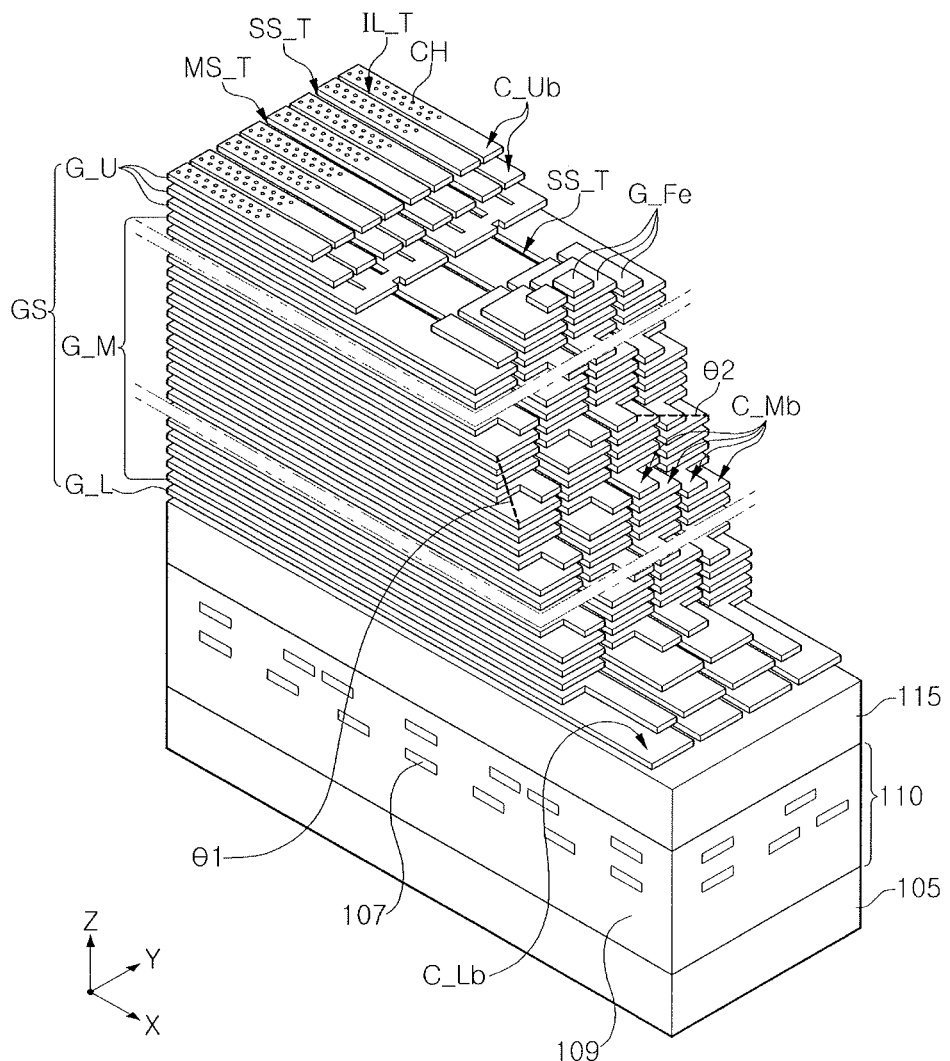
FIG. 21 illustrates a perspective view of a modification of a 3D semiconductor memory device according to an example embodiment.

First, an example of steps of any one of first and second outer step regions E_ST1 and E_ST2 described in FIGS. 1 to 20 will be described with reference to FIG. 21. FIG. 21 illustrates a perspective view of steps in any one of the first and second outer step regions E_ST1 and E_ST2 described above.

Referring to FIG. 21, the lower substrate 105, the lower structure 110 including the peripheral circuit 107, and the base substrate 115, which are the same as those described above, may be disposed.

The gate-stack structure GS may be disposed on the base substrate 115. The gate-stack structure GS may include a lower gate electrode G_L, middle gate electrodes G_M on the lower gate electrode G_L, and one or more upper gate electrodes G_U on the middle gate electrodes G_M. The gate-stack structure GS may have channel holes CH filled with the vertical channel structures VS as described above.

The gate-stack structure GS may be separated in the second direction Y by a main isolating trench MS_T filled with the main separation structure MS described above. For example, the gate-stack structure GS may be penetrated by an auxiliary isolating trench SS_T filled with the auxiliary separation structures SS described above. In addition, an insulating line trench IL_T penetrating through the upper gate electrodes G_U may be positioned. Among the upper gate electrodes G_U, a lowermost electrode may be a dummy gate electrode.

The middle gate electrodes G_M may have outer middle contact regions C_Mb arranged in a step shape stepping downwardly at a first tilt angle θ1 in the first direction X and a step shape stepping downwardly at a second tilt angle θ2 that is smaller than the first tilt angle θ1 on both sides of the main isolating trench MS_T with respect to the main isolating trench MS_T. For example, the outer middle contact regions C_Mb may be arranged in a step shape stepping downwardly by four gate electrodes at a time in the first direction X and in a step shape stepping downwardly by one gate electrode at a time on both sides of the main isolating trench MS_T.

The middle gate electrodes G_M adjacent to the lower gate electrode G_L and the lower gate electrode G_L may have contact regions arranged in a step shape stepping downwardly by one gate electrode at a time in the first direction X and stepping downwardly by one gate electrode at a time in the second direction Y.

In an implementation, edge dummy floating electrodes G_Fe facing the upper gate electrodes G_U may be disposed on the middle gate electrodes G_M. The edge dummy floating electrodes G_Fe may be electrically floated.

For example, at least one of the first and second outer step regions E_ST1 and E_ST2 described above may have steps arranged in a step shape as illustrated in FIG. 21.

Figure 22A:
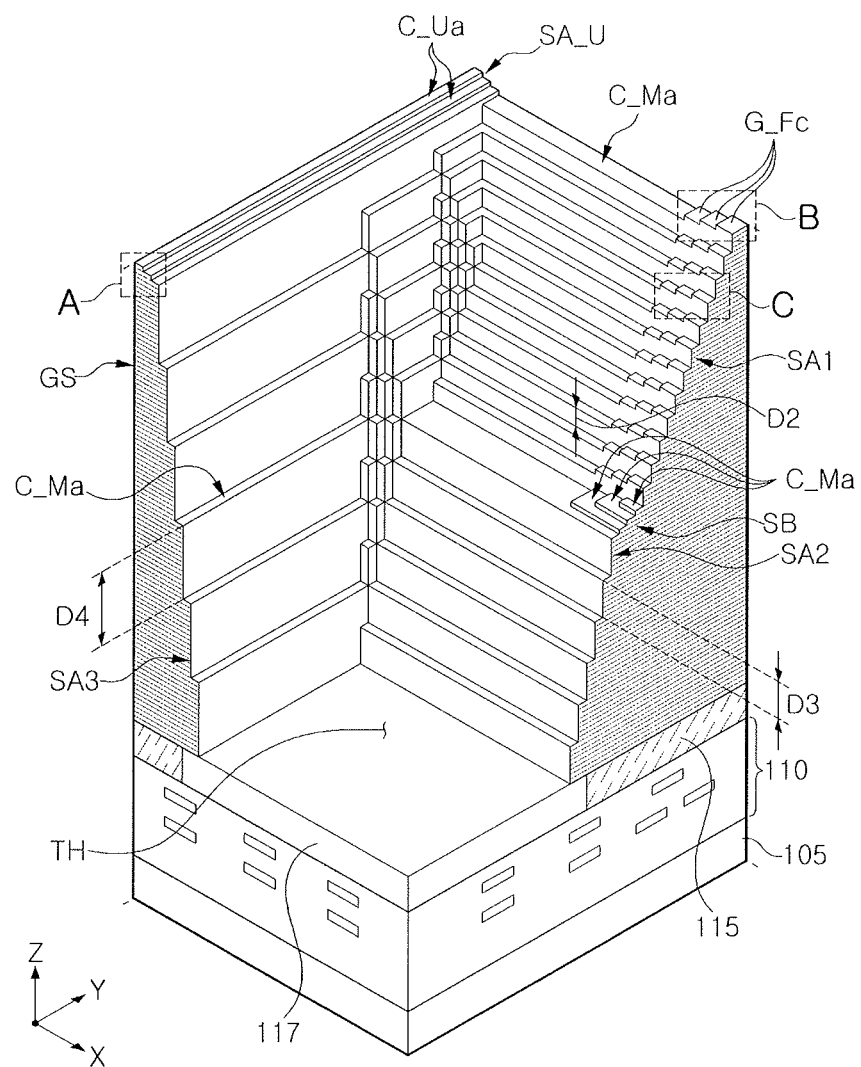
FIG. 22A illustrates a perspective view of a modification of a 3D semiconductor memory device according to an example embodiment.

As described in FIGS. 1 to 20, the gate electrodes of the gate-stack structure GS of the inner step region C_ST may have the gate contact regions arranged in a step shape. A shape of the steps that may be formed by the gate contact regions will be described with reference to FIGS. 22A and 22B. FIG. 22A illustrates a perspective view of a plan of the through region TH and the inner step region C_ST by one-quarter to explain a schematic shape of steps of the inner step regions C_ST described above, and FIG. 22B illustrates a partially enlarged view of a portion indicated by "A" in FIG. 22A, a portion indicated by "B", and a portion indicated by "C".

Figure 22B:
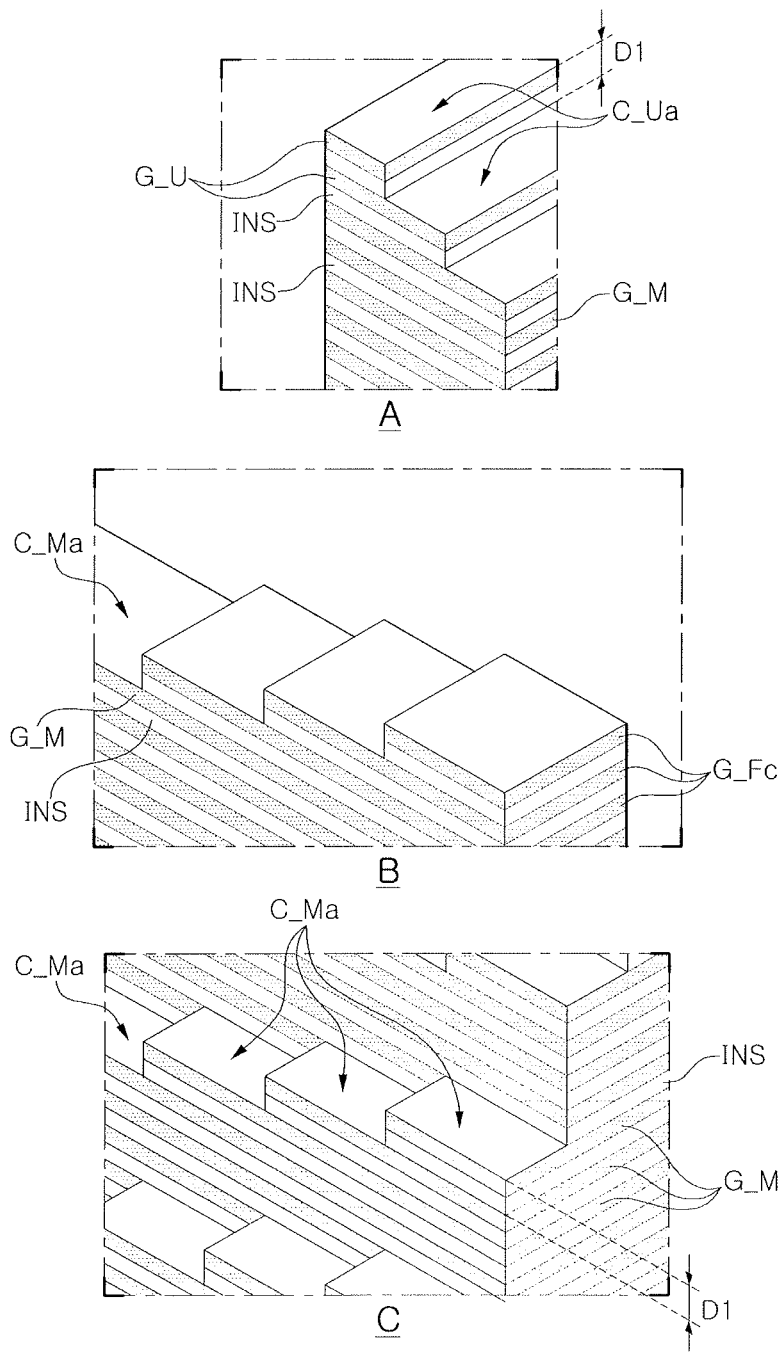
FIG. 22B illustrates a partially enlarged view of a portion of FIG. 21A.

Referring to FIGS. 22A and 22B, the through region TH surrounded by the inner step region C_ST as described above may overlap the gap fill insulating layer 117. Regarding steps formed as the gate contact regions of the gate-stack structure GS are arranged, a shape of the steps formed in the first direction X and a shape of steps formed in the second direction Y may be different. As illustrated in the partially enlarged views of FIG. 22B, the insulating material INS may be positioned between the gate electrodes G_M and G_U.

First, an example of the shape of steps located in the inner step region C_ST when viewed in the second direction Y from the through region TH will be described.

When viewed in the second direction Y from the through region TH, the inner step region C_ST may include a first step structure including steps sequentially stepping downwardly by a first step D1 in the first direction and steps sequentially stepping downwardly by a second step D2 that is greater than the first step D1 in a direction toward the through region TH, a second step structure SA2 disposed below the first step structure SA1 and having steps stepping downwardly by a third step D3 that is greater than the second step D2, and a middle buffer step structure SB positioned between the first step structure SA1 and the second step structure SA2 and having steps stepping downwardly by the first step D1 in the first and second directions X and Y.

When the second direction Y is viewed from the through region TH, the dummy electrodes G_Fc (which are sequentially stepped downwardly in the first direction X and electrically floated) may be disposed above the first step structure SA1 in the inner step region C_ST.

Next, an example of steps located in the inner step region C_ST when viewed in the first direction X from the through region TH will be described.

When viewed in the first direction X from the through region TH, the inner step region C_ST may include a third step structure SA3 having steps stepping downwardly by a fourth step D4 that is greater than the third step D3 and an upper step structure SA_U on the third step structure SA3. The upper step structure SA_U may have steps sequentially stepping downwardly toward the through region TH by the first step D1. Here, the steps of the upper step structure SA_U may be the gate contact regions C_Ua of the upper gate electrodes G_L, which may be formed in plural.

In an implementation, the first step D1 may refer to a height by which the gate electrodes are stepped down one at a time, the second step D2 may refer to a height by which the gate electrodes are stepped down four at a time, the third step D3 may refer to a height by which the gate electrodes are stepped down eight at a time, and the fourth step D4 may refer to a height by which the gate electrodes are stepped down sixteen at a time.

A height difference of the third step structure SA3 may be greater than a height difference of the first step structure SA1. Also, a height difference of the third step structure SA3 may be greater than a height difference of the second step structure SA2.

Figure 23A:
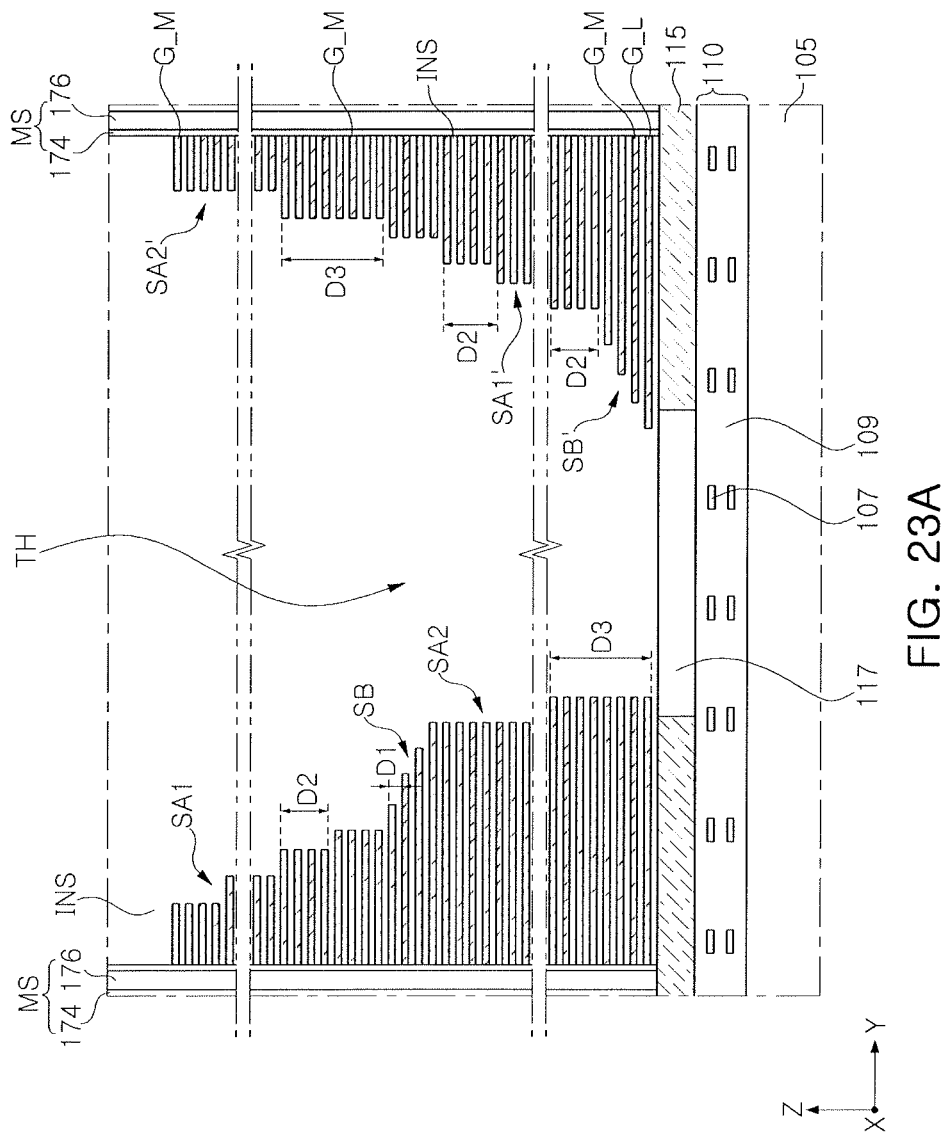

A specific shape of steps of the inner step region C_ST will be described by cutting the planes of the through region TH and the inner step region C_ST in the first direction X and the second direction Y. FIG. 23A illustrates a cross-sectional view of the through region TH and the inner step region C_ST taken in the second direction Y and FIG. 23B illustrates a cross-sectional view of the through region TH and the inner step region C_ST taken in the first direction X. For example, FIG. 23A shows a cross-sectional shape of the through region TH and the inner step region C_ST located between the main separation structures MS described above, and FIG. 23B shows a cross-sectional view of the through region TH and the inner step region C_ST located between the memory cell array regions MA1 and MA2 where the vertical channel structures VS are arranged.

First, an example of the shape of steps when both sides of the inner step region C_ST are viewed in the second direction Y based on the through region TH I will be described with reference to FIG. 23A.

Referring to FIG. 23A, in an example, in FIG. 23A, the gate electrodes in the left portion of FIG. 23A may represent gate electrodes of a cross-section of the right portion of FIG. 22A. Therefore, when the cross-sectional shape of one side of the inner step region C_ST is viewed in the second direction Y based on the through region TH, the first step structure SA1 having the steps stepping downwardly by the second step D2, the second step structure SA2 located below the first step structure SA1 and having the steps stepping downwardly by the third step D3, and the middle buffer step structure SB having the steps stepping downwardly by the first step D1 may be arranged.

When the cross-sectional shape of the other side of the inner step region C_ST is viewed in the second direction Y based on the through region TH, the second step structure SA2' having a shape corresponding to the second step structures SA2, a first step structure SA1' disposed below the second step structure SA2' and having a shape corresponding to the first step structure SA1, and a lower buffer step structure SB' disposed below the first buffer SA1' and corresponding to the middle buffer step structure SB may be disposed.

In an implementation, in the cross-sectional shape of the second direction Y, the second step structure SA2, the middle buffer step structure SB, and the first step structure SA1 may be sequentially disposed on the base substrate 115 on one side of the inner step region C_ST based on the through region TH, and the lower buffer step structure SB', the first step structure SA1', and the second step structure SA2' may be sequentially disposed on the base substrate 115 on both sides of the inner step region C_ST based on the through region TH. In an implementation, in the cross-sectional shape of the second direction Y, one side of the inner step region C_ST and the other side of the inner step region C_ST are asymmetric with respect to the through region TH. In an implementation, in the cross-sectional shape of the second direction Y, both sides of the inner step region C_ST based on the through region TH may be formed to have the same structure as that of any one side of FIG. 23A.

Next, a shape of the steps when both sides of the inner step region C_ST are viewed in the first direction X based on the through region TH will be described with reference to FIG. 23B.

Referring to FIG. 23B, the gate electrodes on the left of FIG. 23B may represent the gate electrodes of the cross-section of the left portion in FIG. 22A. Therefore, when the cross-sectional shape of one side of the inner step region C_ST is viewed in the first direction X based on the through region TH, the third step structure SA3 having steps stepping downwardly by the fourth step D4 and the upper step structure SA_U on the third step structure SA3 may be disposed as described in FIG. 22A. Also, when the cross-sectional shape of the other side of the inner step region C_ST is viewed in the first direction X based on the through region TH, the third step portion SA3' corresponding to the third step structure SA3 and the upper step structure SA_U corresponding to the upper step structure SA_U positioned on the third step structure SA3' may be disposed.

In an implementation, the shape of the steps of the inner step region C_ST may be modified variously. For example, the 3D semiconductor memory device according to an embodiment may include the inner step region C_ST including steps, and may include a suitable shape of steps of the inner step region C_ST which may be variously modified.

Figure 24A:
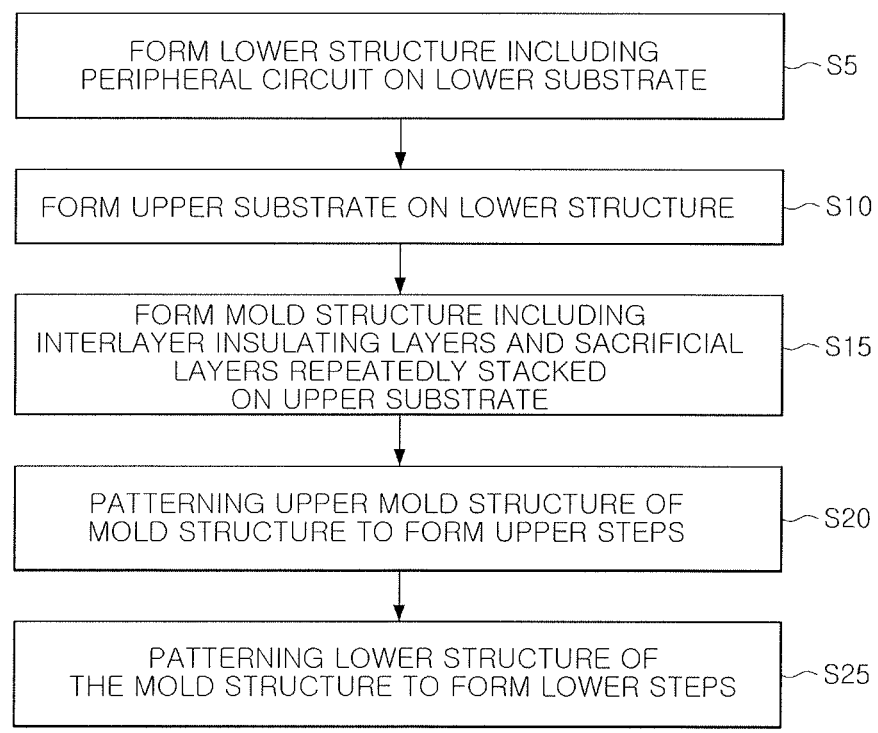
FIGS. 24A and 24B illustrate flowcharts of a method of forming a 3D semiconductor memory device according to an example embodiment.
Figure 24B:
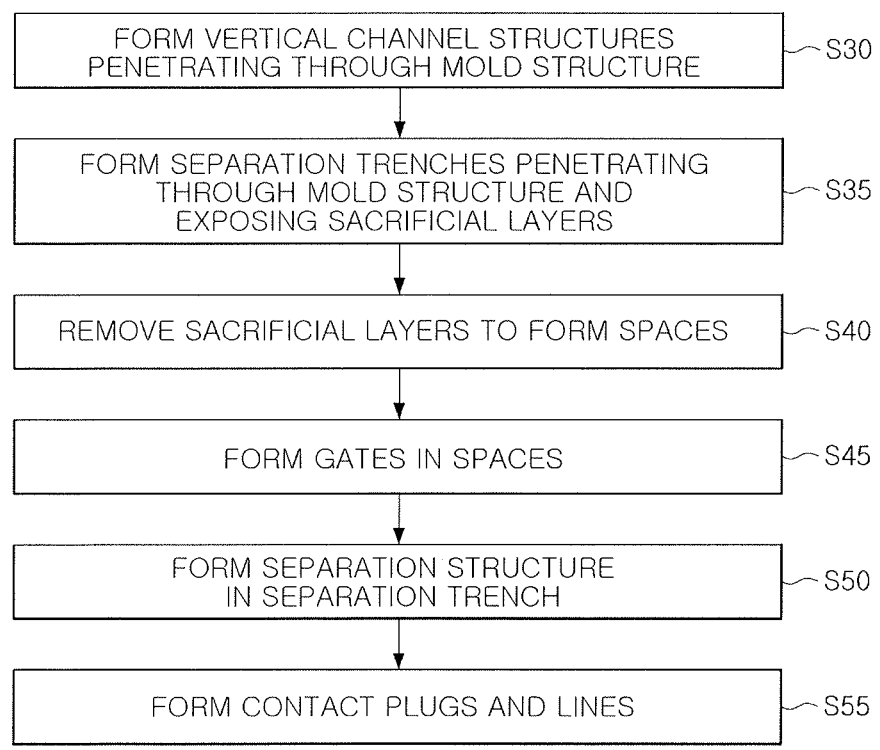

Next, an example of a method of forming a 3D semiconductor memory device according to an example embodiment will be described with reference to FIGS. 24A, 24B, 25, and 26. FIGS. 24A and 24B illustrate flow charts of an example of a method of forming a 3D semiconductor memory device according to an example embodiment, and FIGS. 25 and 26 illustrate perspective views of stages in a method of forming a 3D semiconductor memory device according to an example embodiment.

Figure 25:
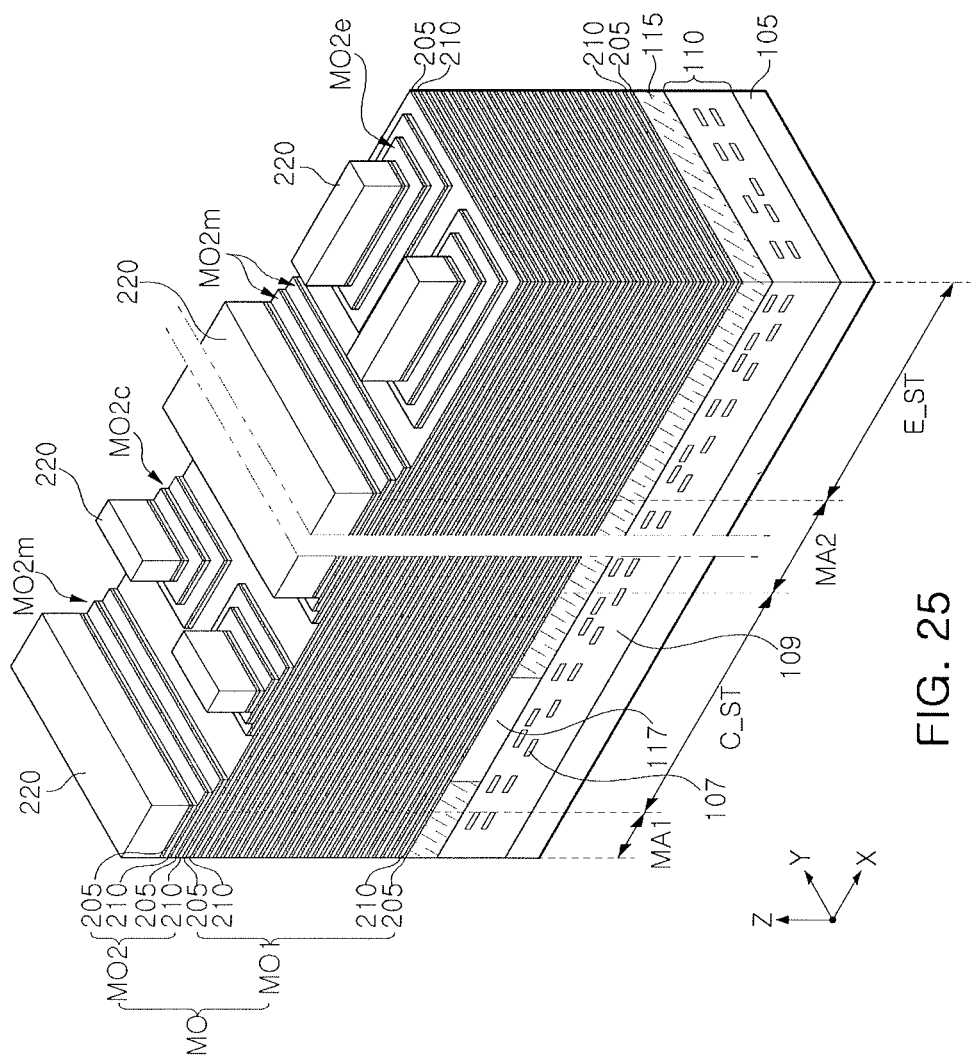
FIGS. 25 and 26 illustrate perspective views of stages in a method of forming a 3D semiconductor memory device according to an example embodiment.
Figure 26:
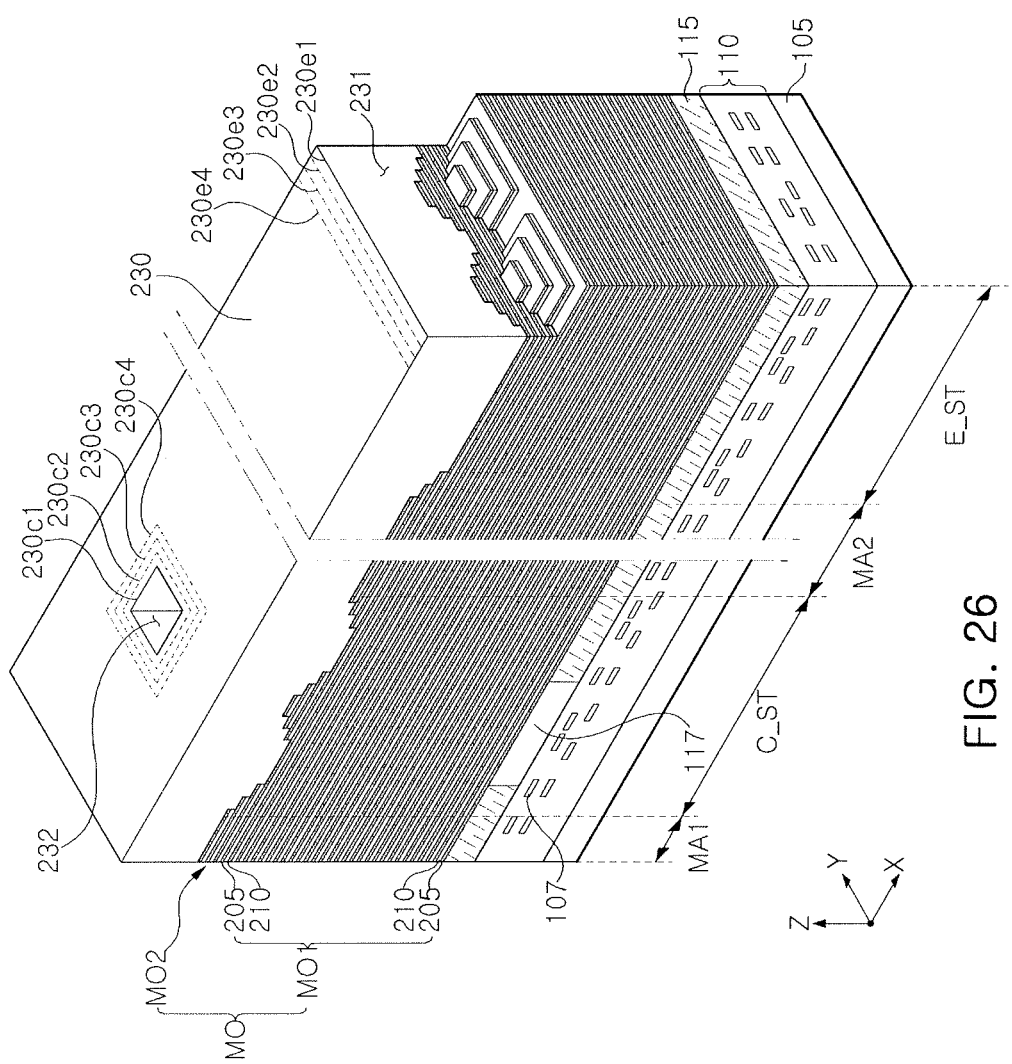

Referring to FIGS. 24A, 24B and 25, a lower structure 110 including a peripheral circuit 107 may be formed on a lower substrate 105 in operation S5. The peripheral circuit 107 may be covered with a lower insulator 109.

An upper substrate 115 may be formed on the lower structure 110 in operation S10. Here, the upper substrate 115 may also be referred to as a base substrate. The upper substrate 115 may be formed of a semiconductor material such as silicon.

A gap fill insulating layer 117 penetrating through the upper substrate 115 may be formed.

On the upper substrate 115, there may be formed memory cell array regions MA, an inner step region C_ST between the memory cell array regions MA, and an outer step region E_ST on an outer side of the memory cell array regions MA. The memory cell array regions MA may include the first and second memory cell array regions MA1 and MA2 described above, the inner step region C_ST may be the inner step region C_ST described above, and the outer step region E_ST may be any one of the first and second outer step regions E_ST1 and E_ST2 described above.

An example of a method of forming the memory cell array regions MA, the inner step region C_ST, and the outer step region E_ST will now be described.

Mold structures MO including interlayer insulating layers 205 and sacrificial layers 210 alternately and repeatedly stacked on the upper substrate 115 may be formed in operation S15. The interlayer insulating layers 205 may be formed of an insulating material such as silicon oxide, or the like, and the sacrificial layers 210 may be formed of a material, e.g., a silicon nitride, having etch selectivity with respect to the interlayer insulating layers 205.

In an implementation, the forming of the mold structures MO may include forming a lowermost sacrificial layer, among the sacrificial layers 210, patterning the lowermost sacrificial layer, and subsequently forming the other interlayer insulating layers 205 and the sacrificial layers 210. Here, the lowermost sacrificial layer may be a layer for forming the lowermost gate electrode G_L described above.

Among the mold structures MO, an upper mold structure MO2 may be patterned to form upper steps in operation S20.

The upper steps may include a memory upper mold step structure MO2m, an outer upper mold step structure MO2e, and an inner upper mold step structure MO2c.

The memory upper mold step structure MO2m may be formed in a position and a shape corresponding to the step structure of the gate contact regions C_Ua and C_Ub of the upper gate electrode G_U described above. FIG. 25 illustrates an example in which a plurality of the upper gate electrodes G_U are formed. For example, the memory upper mold step structure MO2m may have a shape in which the steps are sequentially stepped down.

The outer upper mold step structure MO2e may be formed at the outer step region E_ST and may be used to form the steps sequentially stepping downwardly in the second direction Y described with reference to FIG. 21.

The inner upper mold step structure MO2c may be used to form the steps sequentially stepping downwardly in the first direction X from the first step structure SA1 and the middle buffer step structure SB described in FIG. 22A.

In an implementation, the forming of the outer upper mold step structure MO2e and the inner upper mold step structure MO2c may be omitted.

The forming of the upper steps by patterning the upper mold structure MO2 may include: forming a first photoresist pattern 220, etching one interlayer insulating layer and one sacrificial layer using the first photoresist pattern as an etch mask, reducing a size of the first photoresist pattern, etching one interlayer insulating layer and one sacrificial layer using the first photoresist pattern having a reduced size as an etch mask; reducing the size of the first photoresist pattern again, and etching one interlayer insulating layer and one sacrificial layer using the first photoresist pattern having a reduced size as an etch mask.

Subsequently, the first photoresist pattern 220 having a reduced size may be removed.

Referring to FIGS. 24A, 24B, and 26, the lower structure MO1, among the mold structures MO, may be patterned to form lower steps in operation S25. After the first photoresist pattern 220 described in FIG. 25 is removed, a second photoresist pattern 230 may be formed. The second photoresist pattern 230 may have an inner opening 232 exposing a portion of the inner step region C_ST and an outer opening 231 exposing a portion of the outer step region E_ST. The second photoresist pattern 230 may have a first inner boundary line 230c1 of the inner opening 232 and a first outer boundary line 230e1 of the outer opening 231.

Subsequently, the sacrificial layers 210 and the interlayer insulating layers 205 of the mold structures MO may be etched using the second photoresist pattern 230 as an etch mask. For example, four sacrificial layers and four interlayer insulating layers may be etched using the photoresist pattern 230 as an etch mask.

Thereafter, the mold structures MO may be sequentially etched, while gradually reducing the size of the second photoresist pattern 230. For example, in case where the size of the second photoresist pattern 230 is gradually decreased, the boundary line of the outer opening 231 may be sequentially shifted from the first outer boundary line 230c1 to the second to fourth outer boundary lines 230e2, 230e3, and 230e4, and the boundary of the inner opening 232 may be sequentially shifted from the first inner boundary line 230c1 to the second to fourth inner boundary lines 230c2, 230c3, and 230c4. For example, the sacrificial layers of the mold structures MO may be etched four at four times, while gradually reducing the size of the second photoresist pattern 230, and sixteen sacrificial layers may be etched using the second photoresist pattern 230. In case where the process of etching the mold structures MO using the second photoresist pattern 230 that is gradually reduced in size, the size and position of the inner opening 232 which is repeatedly formed may be appropriately shifted to form the shape of the step structures described above with reference to FIG. 22A. For example, in the inner opening 232 formed four times, boundary lines of the inner opening in a region where the first step structure SA1 is formed may not overlap each other, and boundary lines of the inner opening in the region where the second and third step structures SA2 and SA3 are formed may overlap or may be formed to be adjacent to each other such that the shapes of the steps of the second and third step structures SA2 and SA3 are formed. For example, the mold structures MO may be patterned to the shapes of the steps described above. After the patterned mold structures MO are formed, an insulating material covering the mold structures MO may be formed.

Thereafter, vertical channel structures penetrating through the mold structures MO may be formed in operation S30. The vertical channel structures may be the vertical channel structures VS described in FIGS. 3 to 23B.

Isolating trenches penetrating through the mold structures MO to expose the sacrificial layers 210 may be formed in operation S35. The sacrificial layers 210 exposed by the isolating trenches may be removed to form spaces in operation S40. Gates may be formed in the spaces in operation S45. The gates may include the gate electrodes G_L, G_M, G_U described above and the second gate dielectric 168 described above.

Separation structures may be formed in the isolating trenches in operation S50. The separation structures may be the main separation structures MS and the auxiliary separation structures SS described above. Subsequently, contact plugs and lines may be formed in operation S55.

As described above, according to the example embodiments, the plurality of memory cell array regions MA1 and MA2 may be disposed between the outer step regions E_ST1 and E_ST2, and the inner step region C_ST may be positioned between the memory cell array regions MA1 and MA2. The gate-stack structure GS described above may be positioned in the plurality of memory cell array regions MA1 and MA2 and extend to the first and second outer step regions E_ST1 and E_ST2 and the inner step region C_ST. In addition, the through region TH described above may penetrate through the gate-stack structure GS located in the inner step region C_ST and may be surrounded by the gate-stack structure GS.

The word lines WL of the gate-stack structure GS positioned in the plurality of memory cell array regions MA1 and MA2 may be connected in the inner step region C_ST, and the plurality of memory cell array regions MA1 and MA2 may share the word lines WL. The contact regions of the word lines WL positioned in the first and second outer step regions E_ST1 and E_ST2 and the inner step region C_ST may be used to be electrically connected to the peripheral circuit 107 below the base substrate 115 in which the plurality of memory cell array regions MA1 and MA2 are disposed. The structure of the contact regions arranged in this manner may help reduce (e.g., a number of) peripheral circuits for operating the plurality of memory cell array regions MA1 and MA2, as well as increasing a stacking number of word lines WL, improving integration of the 3D semiconductor memory device.

By way of summation and review, as the number of gate electrodes stacked in the direction perpendicular to the surface of the semiconductor substrate gradually increases, defects generated as the gate electrodes are adjacent to peripheral circuits may also increase.

According to example embodiments, a structure capable of increasing the gate contact regions which may be used to connect the gate electrodes with peripheral circuits may be provided.

According to example embodiments, memory cell array regions that are spaced apart from each other may share the word lines and provide word line contact regions between the memory cell array regions. Therefore, integration may be improved.

The embodiments may provide a three-dimensional semiconductor memory device including a through region penetrating through a gate structure.

The embodiments may provide a highly-integrated three-dimensional semiconductor memory device and a method of forming the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:
   a gate-stack structure on a base substrate, the gate-stack structure including interlayer insulating layers and gate electrodes that are alternately stacked, wherein the gate electrodes include word lines, and first upper select lines and second upper select lines on the word lines, and wherein the first upper select lines are spaced apart from the second upper select lines;
   a through region penetrating completely through the gate-stack structure to the base substrate, surrounded by the word lines of the gate-stack structure, and disposed between the first upper select lines and the second upper select lines; and
   first vertical channel structures and second vertical channel structures on both sides of the through region and penetrating through the gate-stack structure,
   wherein the through region is between the first vertical channel structures and the second vertical channel structures, and
   wherein the gate electrodes include a metal material.

2. The three-dimensional semiconductor memory device as claimed in claim 1, wherein:
   the gate-stack structure includes first outer contact regions and second outer contact regions on opposing sides of the gate-stack structure and inner contact regions between the first outer contact region and the second outer contact region,
   the first vertical channel structures are between the first outer contact regions and the inner contact regions; and
   the second vertical channel structures are between the second outer contact regions and the inner contact regions.

3. The three-dimensional semiconductor memory device as claimed in claim 2, further comprising separation structures penetrating through the gate-stack structure, the separation structures extending in a first direction that is parallel to the surface of the base substrate,
   wherein the separation structures include a main separation structure separating the gate-stack structure in a second direction that is parallel to the surface of the base substrate and perpendicular to the first direction.

4. The three-dimensional semiconductor memory device as claimed in claim 3, wherein some of the separation structures penetrate through the inner contact regions.

5. The three-dimensional semiconductor memory device as claimed in claim 4, wherein at least some of the separation structures penetrating through the inner contact regions, among the separation structures include a portion protruding in the second direction that is perpendicular to the first direction from a line shape extending in the first direction, when viewed on a plane.

6. A three-dimensional semiconductor memory device, comprising:
   a plurality of memory cell array regions on a base substrate;
   a first step region adjacent to the plurality of memory cell array regions in a first direction;
   a second step region between the plurality of memory cell array regions;
   a gate-stack structure in the plurality of memory cell array regions, the first step region, and the second step region, wherein the gate-stack structure includes interlayer insulating layers and gate electrodes that are alternately stacked;
   separation structures penetrating through the gate-stack structure, the separation structures extending in the first direction; and
   a through region completely penetrating through the gate-stack structure to the base substrate in the second step region, wherein the through region is between the plurality of memory cell array regions and is between the separation structures,
wherein a length in the first direction of the through region is greater than a length in a second direction of the through region,
wherein the second direction is perpendicular to the first direction, and
wherein the first and second direction are parallel to an upper surface of the base substrate.

7. The three-dimensional semiconductor memory device as claimed in claim 6, wherein:
the gate electrodes include word lines including a metal material.

8. The three-dimensional semiconductor memory device as claimed in claim 6, further comprising:
a lower substrate below the base substrate;
a lower structure between the lower substrate and the base substrate and including a peripheral circuit; and
a gap fill insulating layer penetrating through the base substrate,
wherein the gap fill insulating layer overlaps the through region.

9. The three-dimensional semiconductor memory device as claimed in claim 8, further comprising:
an inner peripheral contact plug penetrating through the through region and the gap fill insulating layer and electrically connected to the peripheral circuit.

10. The three-dimensional semiconductor memory device as claimed in claim 6, further comprising:
outer contact plugs on an outer contact region of the gate electrodes;
outer peripheral contact plugs adjacent to the outside of the base substrate and electrically connected to the peripheral circuit; and
outer gate connection lines electrically connecting the outer contact plugs to the outer peripheral contact plugs.

11. The three-dimensional semiconductor memory device as claimed in claim 6, further comprising:
a lower substrate below the base substrate;
a lower structure between the lower substrate and the base substrate and including a peripheral circuit;
a gap fill insulating layer penetrating through the base substrate;
vertical channel structures penetrating through the gate-stack structure in the plurality of memory cell array regions;
bit lines electrically connected to the vertical channel structures; and
a peripheral bit line contact plug penetrating through the through region and the gap fill insulating layer, and electrically connecting the peripheral circuit to the bit line.

12. The three-dimensional semiconductor memory device as claimed in claim 6, wherein:
the gate-stack structure in the first step region have a step shape that steps downwardly in a direction away from the memory cell array regions, and
the gate-stack structure in the second step region have a step shape that steps downwardly in the first direction toward the through region and downwardly in the second direction toward the through region.

13. The three-dimensional semiconductor memory device as claimed in claim 6, wherein the through region is surrounded by the gate-stack structure on the same plane.

14. A three-dimensional semiconductor memory device, comprising:
a gate-stack structure on a base substrate; and
a through region penetrating through the gate-stack structure, the through region being surrounded by the gate-stack structure,
wherein:
the gate-stack structure includes word lines, and first and second select lines, on the word lines and extending in a first direction that is parallel to a surface of the base substrate,
the word lines include inner contact regions having a shape of a step that steps downwardly in the first direction toward the through region and a shape of a step that steps downwardly in a second direction toward the through region, and
the second direction is parallel to the surface of the base substrate and perpendicular to the first direction.

15. The three-dimensional semiconductor memory device as claimed in claim 14, further comprising:
a lower substrate below the base substrate;
a lower structure between the lower substrate and the base substrate and including a peripheral circuit;
a gap fill insulating layer penetrating through the base substrate;
a peripheral contact plug penetrating through the through region and the gap fill layer and electrically connected to the peripheral circuit;
an inner contact plug electrically connected to at least one of the inner contact regions; and
an inner gate connection line electrically connecting the peripheral contact plug to the inner contact plug.

16. The three-dimensional semiconductor memory device as claimed in claim 14, wherein the inner contact regions positioned in the second direction with respect to the through region are arranged as at least two step structures stepping downwardly with different distances between steps.

17. The three-dimensional semiconductor memory device as claimed in claim 16, wherein the inner contact regions in the first direction with respect to the through region have different step structures stepping downwardly with a distance between steps that is greater than the different distances between steps of the step structures of the inner contact regions in the second direction with respect to the through region.

18. The three-dimensional semiconductor memory device as claimed in claim 14, further comprising vertical channel structures penetrating through the gate-stack structures,
wherein the vertical channel structures include a gate dielectric extending in a direction perpendicular to a surface of the base substrate and a channel semiconductor layer extending in the direction perpendicular to the surface of the base substrate and between the gate-stack structure and the gate dielectric.

* * * * *